US 6,552,954 B2

(12) United States Patent
Fujisawa et al.

(10) Patent No.: US 6,552,954 B2
(45) Date of Patent: Apr. 22, 2003

(54) SEMICONDUCTOR INTEGRATED CIRCUIT DEVICE

(75) Inventors: Hiroki Fujisawa, Sagamihara (JP); Masashi Horiguchi, Koganei (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/842,865

(22) Filed: Apr. 27, 2001

(65) Prior Publication Data

US 2001/0038569 A1 Nov. 8, 2001

(30) Foreign Application Priority Data

Apr. 27, 2000 (JP) ........................................ 2000-126813

(51) Int. Cl.[7] ................................................ G11C 8/00
(52) U.S. Cl. .................. 365/233; 365/189.05; 365/202; 365/207; 327/51; 327/57
(58) Field of Search ........................... 365/233, 189.05, 365/189.07, 190, 195, 196, 201, 202, 203, 205, 207, 208; 327/51, 57

(56) References Cited

U.S. PATENT DOCUMENTS 5,333,127 A * 7/1994 Hiraki et al. .......... 128/203.29
5,455,802 A * 10/1995 McClure ...................... 326/51
6,400,623 B2 * 6/2002 Ohno ......................... 365/201

FOREIGN PATENT DOCUMENTS

JP 8-227581 9/1996

* cited by examiner

Primary Examiner—Richard Elms
Assistant Examiner—VanThu Nguyen
(74) Attorney, Agent, or Firm—Antonelli, Terry, Stout & Kraus, LLP

(57) ABSTRACT

A selection circuit is provided for first and second latch circuits which operate in response to first and second operation timing signals, respectively. By the selection circuit, a first operation of transmitting a signal corresponding to a first output signal of the first latch circuit to a third output terminal, and a second operation of transmitting a second output signal in place of the first output signal to the third output terminal when the first output is different from the second output signal of the second latch circuit are performed. The second operation timing signal is generated behind the first operation timing signal, and the operation period of the second latch circuit is shortened as necessary in the first operation.

21 Claims, 14 Drawing Sheets

READ MODE

WRITE MODE

SEMICONDUCTOR INTEGRATED CIRCUIT DEVICE

BACKGROUND OF THE INVENTION

The present invention relates to a semiconductor integrated circuit device and, for example, to a technique which is effective for use in an amplification circuit, such as a main amplifier suitable for a semiconductor storage device which is required to perform a reading operation at high speed.

It was found by investigation subsequent to the present invention that there is known technology related to the present invention. For example, there are descriptions of such technology in Japanese Unexamined Patent Application Nos. 8(1996)-227581 (hereinbelow, called conventional art 1) and 6(1994)-349282 (corresponding to U.S. Pat. No. 5,1455,802, hereinbelow called conventional art 2). The publication of the conventional art 1 discloses that two latch-type sense amplifiers of different data latching timings are used; and, when outputs of the sense amplifiers are different from each other, priority is placed on the output of the sense amplifier whose latch timing is later. The publication of the conventional art 2 discloses that two dynamic sense amplifiers for reading data of memory cells at different timings are provided; and, when an output of the sense amplifier whose latch timing is later is different from an output that whose latch timing is earlier, priority is placed on the output of the sense amplifier whose latch timing is later. The publications of the conventional arts 1 and 2 do not describe the necessity of realizing higher processing speed at the time of continuous operation and provision of a simpler circuit, as achieved by the present invention.

SUMMARY OF THE INVENTION

The conventional arts 1 and 2 are directed to the prevention of erroneous operation due to process variations and fluctuations in power and do not consider improvement in practical memory operation speed. Specifically, in the case of operating two latch-type amplifiers at different timings, as described above, the time necessary for an amplifying operation of the two amplifiers certainly increases in accordance with the amount of deviation between the timings. A memory circuit mounted on a digital signal processing system, such as a microcomputer, is hardly accessed discretely. Unlike the conventional arts 1 and 2, therefore, it is not so important for a memory circuit used in digital signal processing to shorten the time from the start of access to a memory cell until the output of the data.

In a digital signal process, data is successively written/read to/from a memory circuit. In the case of successively reading plural storage data, after amplifying the data, it is necessary to reset the amplifying state of the amplification circuit and perform an operation for amplifying the next data. In order to perform such a successive data amplifying operation at high speed, it is important to shorten the operation period of the amplification circuit. When two latch circuits are provided as described above, other problems arise, in that the circuit scale enlarges accordingly and the power consumption increases.

An object of the invention is to provide a semiconductor integrated circuit device, including an amplification circuit, which is capable of realizing a higher practical processing speed and an improved operation margin.

Another object of the invention is to provide a semiconductor integrated circuit device, including an amplification circuit, which is capable of realizing higher processing speed and an improved operation margin, and, in addition, has a smaller area and exhibits a power saving.

The above and other objects and novel features of the invention will become apparent from the following description and the attached drawings.

An embodiment of the invention disclosed herein will be briefly described as follows. A selection circuit is provided for first and second latch circuits which operate in response to first and second operation timing signals, respectively. By use of the selection circuit, a first operation of transmitting a signal corresponding to a first output signal of the first latch circuit to a third output terminal, and a second operation of transmitting a second output signal in place of the first output signal to the third output terminal when the first output is different from the second output signal of the second latch circuit are performed. The second operation timing signal is generated after the first operation timing signal, and the operation period of the second latch circuit is shortened according to the operation frequency in the first operation.

DETAILED DESCRIPTION OF THE INVENTION

Figure 1:
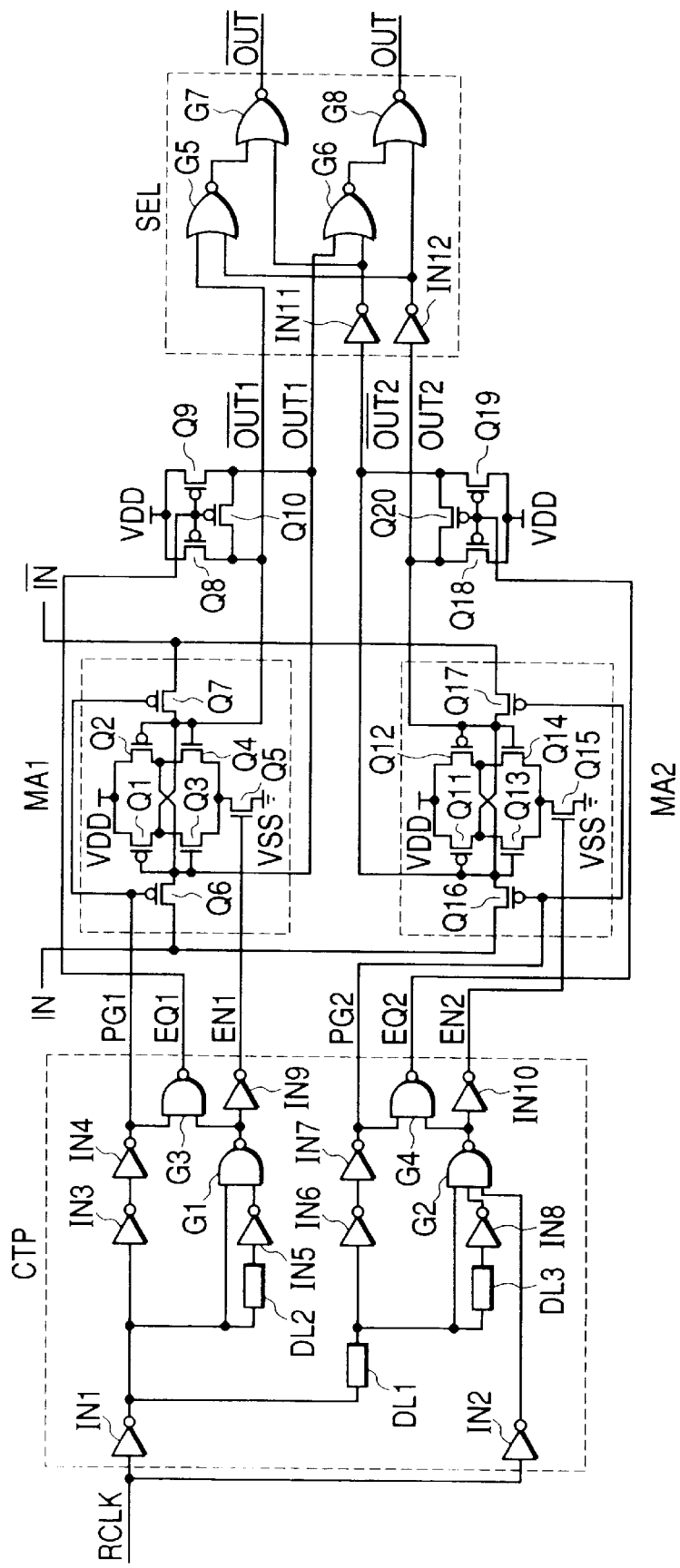
FIG. 1 is a schematic circuit diagram showing an example of an amplification circuit used for a semiconductor integrated circuit device according to the invention.

FIG. 1 is a circuit diagram showing an amplification circuit for use in a semiconductor integrated circuit device according to an embodiment of the invention. Although the invention is not limited, the amplification circuit of the embodiment is directed to a main amplifier provided for a semiconductor storage device, such as a dynamic RAM (Random Access Memory).

The amplification circuit of the embodiment has amplifiers MA1 and MA2 including two latch circuits connected in parallel, a control circuit CTP for controlling the amplifiers MA1 and MA2 at different timings while realizing improved operation frequencies of the amplifiers MA1 and MA2, and a selector SEL for placing priority on an output of a later timing. The amplifier MA1 has, although the invention is not so limited, a latch circuit in which input and output terminals of two CMOS inverter circuits, one of which is comprised of a p-channel MOSFET Q1 and an n-channel MOSFET Q3 and the other of which is comprised of a p-channel MOSFET Q2 and an n-channel MOSFET Q4, are connected so as to cross each other, and an n-channel MOSFET Q5 for passing an operation current to the two CMOS inverter circuits.

A power voltage VDD is applied to the sources of the p-channel MOSFETs Q1 and Q2, and the n-channel MOSFET Q5 is provided between IS the sources of the n-channel MOSFETs Q3 and Q4 and a ground potential VSS of the circuit. A timing signal EN1 is supplied to the gate of the MOSFET Q5. When the timing signal EN1 is at the high level, the MOSFET Q5 is turned on to thereby pass a current necessary for the amplifying operation of the latch circuit constructed by the two CMOS inverter circuits.

The amplifier MA2 has a latch circuit in which input and output terminals of two CMOS inverter circuits, one of which is comprised of a p-channel MOSFET Q11 and an n-channel MOSFET Q13 and the other of which is comprised of a p-channel MOSFET Q12 and an n-channel MOSFET Q14, are connected so as to cross each other, and an n-channel MOSFET Q15 for passing an operation current to the two CMOS inverter circuits. A timing signal EN2 is supplied to the gate of the MOSFET Q15. When the timing signal EN2 is at the high level, the MOSFET Q15 is turned on to thereby pass a current necessary for the amplifying operation of the latch circuit constructed by the two CMOS inverter circuits.

A pair of output terminals OUT1 and /OUT1 of the amplifier MA1 is provided with a precharge circuit having p-channel MOSFETs Q8 and Q9 for supplying the power voltage VDD and a p-channel short-circuiting MOSFET Q10 connecting the pair of output terminals OUT1 and /OUT1. Similarly, a pair of output terminals OUT2 and /OUT2 of the other amplifier MA2 is provided with a precharge circuit having p-channel MOSFETs Q18 and Q19 for supplying the power voltage VDD and a p-channel short-circuiting MOSFET Q20 connecting the pair of output terminals OUT2 and /OUT2.

A pair of input terminals of the amplifier MA1 is provided with an input gate circuit having p-channel MOSFETs Q6 and Q7 for transmitting complementary input signals IN and /IN. A timing signal PG1 for latching an input signal is supplied to the gates of the MOSFETs Q6 and Q7. Similarly, a pair of input terminals of the other amplifier MA2 is provided with an input gate circuit having p-channel MOSFETs Q16 and Q17 for transmitting the complementary input signals IN and /IN. A timing signal PG2 for latching input signals is supplied to the gates of the MOSFETs Q16 and Q17.

When each of the amplifiers MA1 and MA2 performs an amplifying operation, the input gate circuit plays the role of isolating input lines for transmitting the input signals IN and /IN by being turned off. In the case of using the amplification circuit according to the invention as a main amplifier of a dynamic RAM, as will be described hereinlater, the input line through which the input signal is transmitted has a relatively large parasitic capacity like a main input/output line MIO, as will be described hereinlater. By isolating the input line at the time of the amplifying operation, the amplifying operations of the amplifiers MA1 and MA2 can be performed at high speed. Consequently, when the capacity of the input signal line for transmitting an input signal to the amplification circuit is small, the input gate circuit is not necessary.

In response to a clock signal RCLK, the control circuit CTP generates the timing signals EN1 and EN2 for making the amplifiers MA1 and MA2 operative, the timing signals PG1 and PG2 for controlling the input gates, and equalization (precharge) signals EQ1 and EQ2 for controlling the precharge circuits. A delay circuit DL1 generates a delay signal for delaying an operation start timing of the amplifier MA2 with respect to the operation start timing of the amplifier MA1. A delay circuit DL2, an inverter circuit IN6, and a gate circuit GI construct a one-shot pulse generating circuit to set an operation period of the amplifier MA1 in correspondence with the delay time of the delay circuit DL2. Similarly, a delay circuit DL3, an inverter circuit IN8, and a gate circuit G2 construct a one-shot pulse generating circuit to set an operation period of the amplifier MA2 in correspondence with the delay time of the delay circuit DL3.

The selector SEL has gate circuits G5 to G8 provided in correspondence with the output terminals OUT1, /OUT1, OUT2, and /OUT2 of the two amplifiers MA1 and MA2 and inverter circuits IN11 and IN12. In the case where an amplification result of the amplifier MA1 is outputted and an amplification result of the amplifier MA2 is different from that of the amplifier MA1, the selector SEL outputs again the result of amplification of the amplifier MA2 in place of the result of amplification of the amplifier MA1. The amplification circuit, control circuit, and selector a re just an example. Any circuits can be used, as long as they realize functions similar to the above.

As described above, by providing the circuit having the amplifiers MA1 and MA2 using the pairs of latch circuits of different data latch timings and preferentially outputting the result of the amplification circuit which latches data later than the other, a situation in which erroneous data is amplified when latch timings are deviated from each other due to device variations can be prevented. Specifically, when a device is designed while assuring a timing margin under the device best conditions, the timing margin becomes excessive, and it causes a problem such that an access delay occurs under the device worst conditions. The operation timing of the amplifier MA1 in the first phase is therefore determined so that the input signal amount becomes the optimum under the device worst conditions.

Consequently, the excessive timing margin in the device worst conditions becomes zero and the processing speed becomes high. Although erroneous operation occurs due to an insufficient signal amount at the timing of the first phase under the device best conditions in this time, since the operation timing of the amplifier MA2 in the second phase is delayed, by outputting the result again, the circuit operates accurately. Under such device best conditions, the operation speed of the circuit is generally high. Even when the two amplifiers MA1 and MA2 operate at deviated timings, access delay does not occur. The above configuration is similar to those of the conventional arts 1 and 2.

However, the excessive timing margin becomes zero under the device worst conditions and the processing speed becomes high only in the amplifier MA1 in the first phase. The conventional arts 1 and 2 fail to recognize the face that the amplifier MA2 in-the second phase similarly operates and performs an amplifying operation also under the device worst conditions. That is, under device worst conditions, the operation speed of the circuit is generally low, so that the input signal amount is assured and the amplifier MA1 in the first phase operates normally. Moreover, since the operation period of the amplifier MA2 in the second phase of which circuit operation is made slow is added, time consumed for the whole operation becomes long.

In the embodiment, in order to solve the foregoing problem, the control signal EN2 of a late timing is forcedly reset by using the clock signal RCLK of the next cycle by the control circuit CTP, thereby automatically limiting the vain operation period of the second phase. In other words, even when the operation timing signal EN2 of the amplifier MA2 in the second phase is active, the timing signal EN2 is forcedly reset by the arrival of the clock signal RCLK for the operation of the next cycle. Thus, while using the two amplifiers MA1 and MA2, the operating periods can be automatically shortened according to the operation frequency.

Figure 2A:
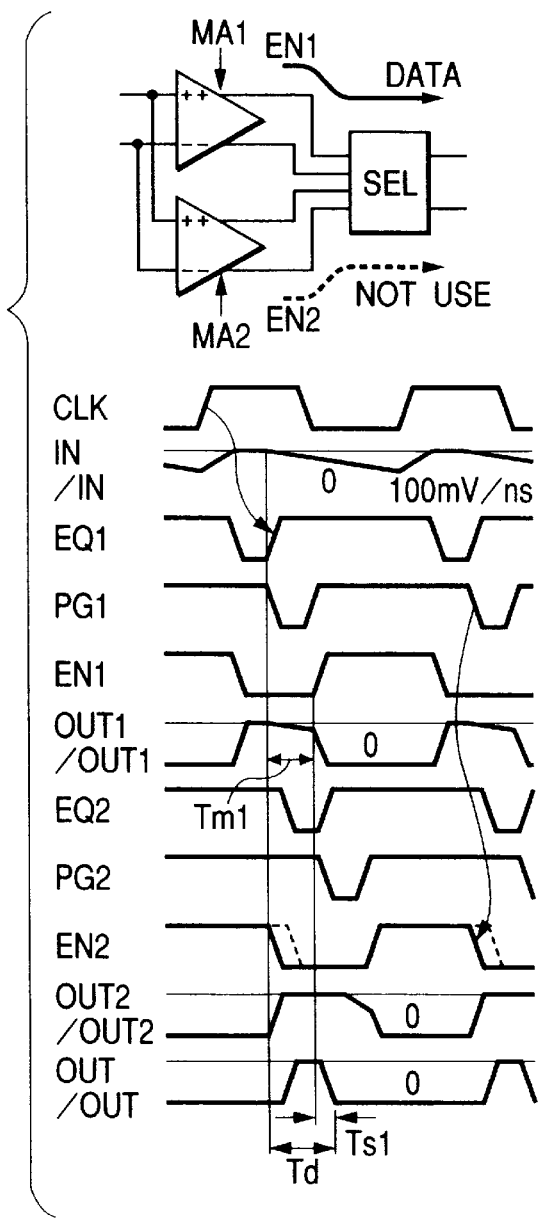
FIGS. 2A and 2B are diagrams illustrating operation of the invention.
Figure 2B:
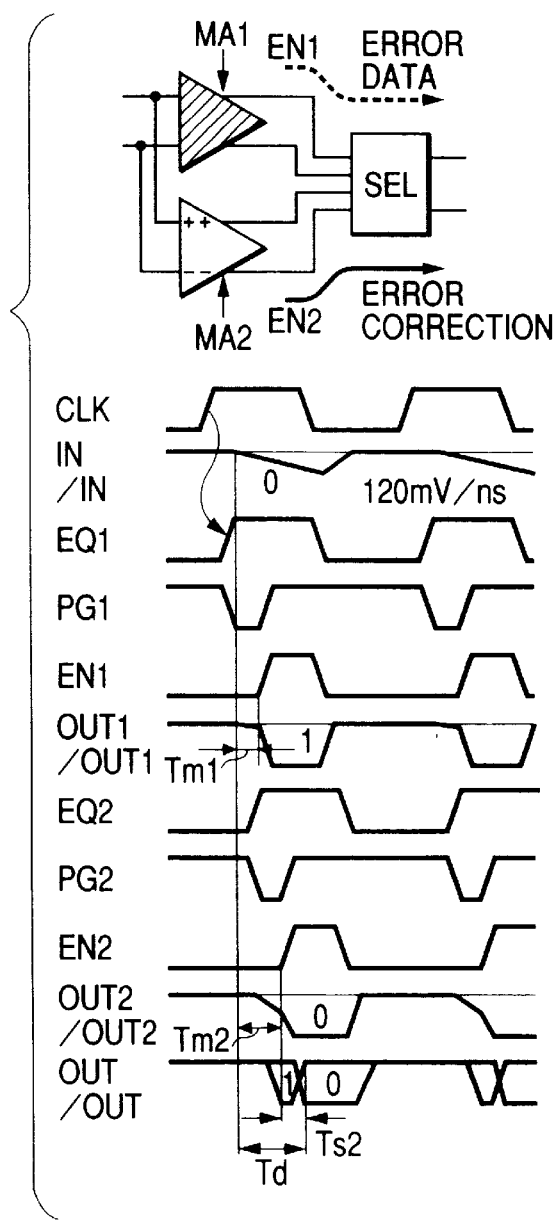

FIGS. 2A and 2B are diagrams for illustrating the operation of the invention. As shown in FIG. 2A, the operation timing signal EN1 in the first phase is determined so that the signal amount of the amplifier MA1 becomes the optimum under the device worst conditions. The result of amplification is outputted as it is via the selector SEL. Consequently, there is no excessive timing (Tm1) under the device worst conditions and the access time is the shortest.

On the other hand, under the device best conditions, as shown in FIG. 2B, the circuit operation is performed at high speed and timings are generally advanced. By the operation timing signal EN1 in the first phase, a margin sufficient to assure the necessary input signal amount, such as the time Tm1, cannot be assured, The amplifier MA1 therefore performs an erroneous amplifying operation. Under the device best conditions, therefore, the operation timing signal EN2 in the second phase is set so as to obtain a sufficient margin to assure the necessary input signal amount, such as time Tm2. Consequently, although the amplifier MA1 in the first phase outputs an erroneous result, an output signal of the amplifier MA2 in the second phase is outputted again by the selector SEL, thereby automatically correcting the data. The access time under the device best conditions is generally short and does not become longer than that under the worst conditions. There is no problem with the access time from the viewpoint of speed.

In order to prevent the operation period of the amplifier MA2 from overlapping with the next cycle started by the next clock CLK under the device worst conditions, at the trailing edge of the signal PG1 of the next cycle, that is, in the period of latching the input signal of the next cycle of the amplifier MA1 in the first phase, the operation timing EN2 of the amplifier MA2 in the second phase is forcedly reset (to the low level), and the equalization signal EQ2 to stop the amplifier MA2 is generated. By this operation, the frequency of the clock signal CLK can be set as high as that under the device best conditions. Under such device worst conditions, the amplifier MA1 in the first phase operates accurately, so that the amplifying operation of the amplifier MA2 in the second phase is unnecessary. When the operation period is limited as described above, there is no problem.

Figure 3:
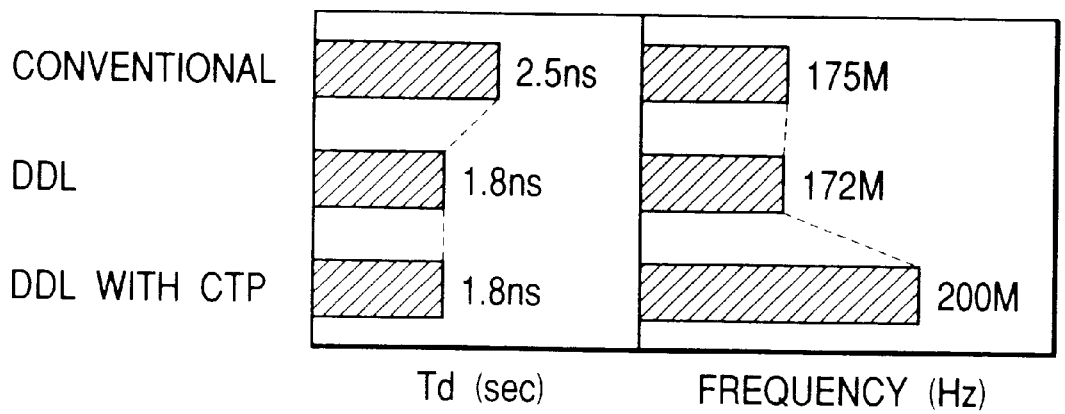
FIG. 3 is a diagram showing a delay amount and operation frequency in the case of using an amplification circuit according to the invention.

FIG. 3 is a diagram of delay amount and operation frequency in the case of using the amplification circuit according to the invention- One of the problems occurring when two latch circuits as described above (double data latch, hereinbelow, called DDL) are used is low operation frequency. Specifically, by using the latch circuit (DDL) controlled by two timing signals as in the conventional arts 1 and 2, the timing margin can be optimized, and a delay amount Td from the accessing of the memory to output of data can be reduced. The operation frequency, however, cannot be increased since the latch circuit operating at low speed continuously operates.

By using the control circuit CTP according to the invention to deal with this problem, the control signal of a late timing is forcedly reset by the control signal of an early timing, so that the operation frequency can be largely improved. Even when the control signal of a late timing is regulated, since the amplification signal of the latch circuit which operates at low speed is not used under the device worst conditions, no problem occurs. On the other hand, under the device best conditions, the circuit operation is generally performed at high speed. Even when the DDL operates in response to the clock in the second phase, the operation frequency does not decrease. By employing the configuration of the DDL with the CTP as described above, both the delay time (Td) and the operation frequency can be improved.

Figure 4:
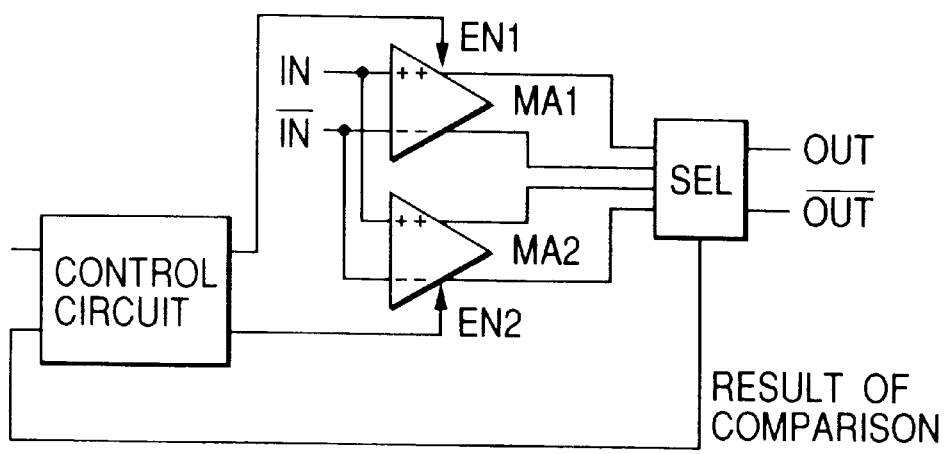
FIG. 4 is a block diagram showing another example of a control circuit CTP.

FIG. 4 is a block diagram of another example of the control circuit CTP. In the example, the control circuit CTP is characterized in that, when outputs of the two latch circuits coincide with each other, a reset signal is generated in a manner different from the configuration of FIG. 1 in which the next clock is used as a signal for resetting the amplifier MA2 operating at a late timing. Specifically, when the outputs of the two latch circuits coincide with each other, the result of amplification of the amplifier MA2 of a late timing is unnecessary. The operation timing signal EN2 of the amplifier MA2 is reset in accordance with the result of comparison. In such a manner, the operation frequency can be improved.

When the outputs of the two latch circuits do not coincide with each other, the output of the amplifier MA2 of a late timing is used, so that the amplifier MA2 is not reset. In this example as well, under the device best conditions, the speed of the circuit operation is generally high. Consequently, even when the two latch circuits (amplifiers) MA1 and MA2 operate in response to the two-phase clocks EN1 and EN2, the operation frequency does not decrease. Both the delay time (Td) and the operation frequency, therefore, can be improved.

Figure 5:
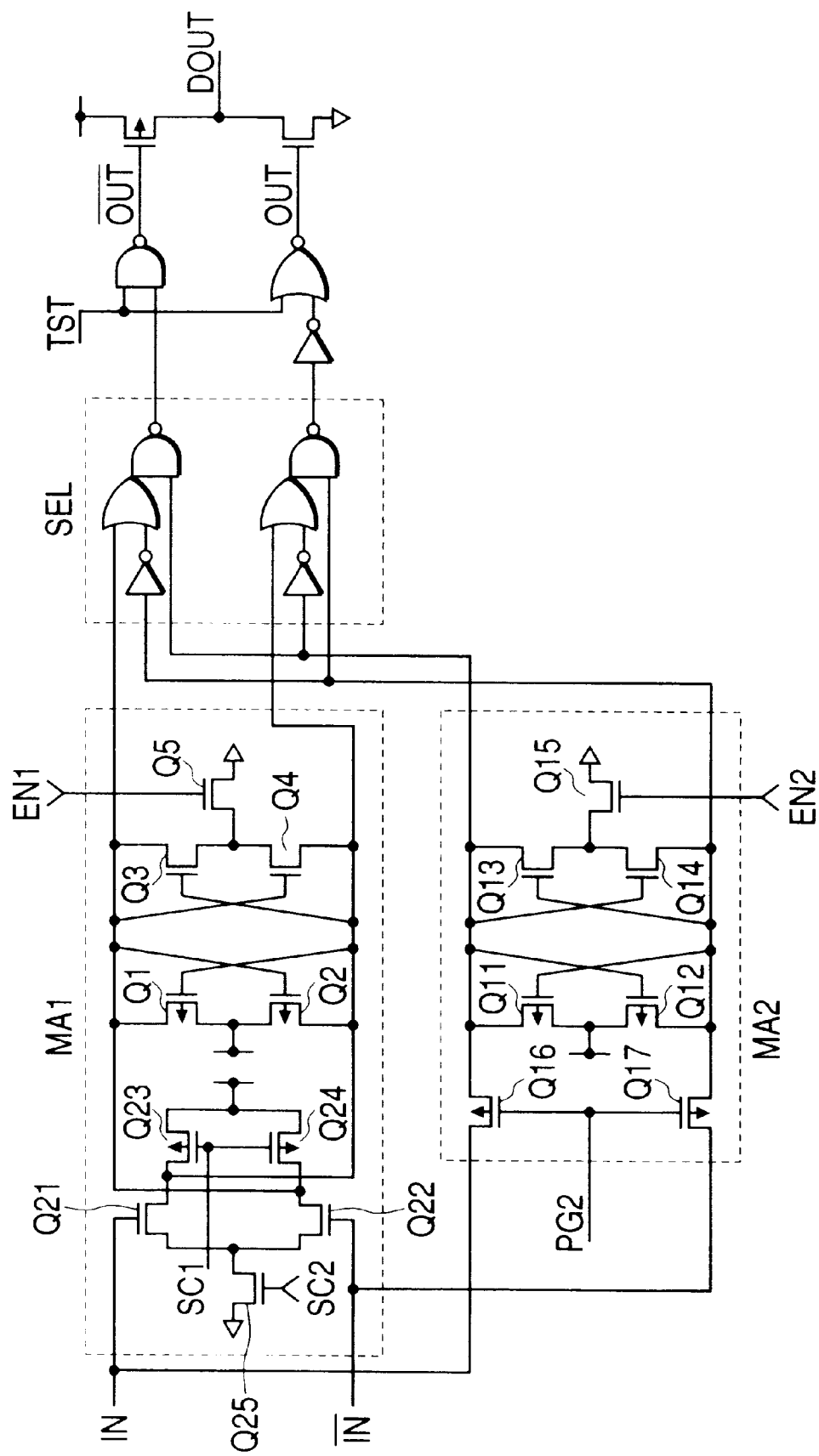
FIG. 5 is a schematic circuit diagram showing another example of the amplification circuit according to the invention.

FIG. 5 is a circuit diagram of another example of the amplification circuit according to the invention. In the drawing, a selection circuit and an output circuit provided for an output section are also shown. The example is characterized in that an amplification circuit of a gate input type is used as the amplifier MA1 in the input section, and an amplifier of a pass gate type similar to the above is used as the amplifier MA2. Specifically, in place of the MOSFETs Q6 and Q7 in the input gate unit in the amplifier MA1 in the example of FIG. 1, a differential amplifier of a gate input type including n-channel differential MOSFETs Q21 and Q22, p-channel MOSFETs Q23 and Q24 operating as a 1 odd, and an n-channel MOSFET Q25 for passing an operation current to the differential MOSFETs Q21 and Q22 is provided. A timing signal SC2 is supplied to the gate of the MOSFET Q-25 as a component of the gate input type differential amplifier, and a timing signal SC1 is supplied to the gates of the MOSFETs Q23 and Q24. The MOSFETs Q23 and Q24 act as an equalizer of a latch circuit at a post stage and a load of the differential MOSFETs Q21 and Q22.

Generally, the gate input type amplifier is regarded as a more advantageous one with respect to speed since an amplification effect is expected. When the gate input type amplifier operates for the same time as the latch circuit at the post stage, the amount of current consumption increases. It is desirable to set the timing signal SC1 to the low level to turn off the MOSFET Q25 when the latch circuit at the post stage starts the amplifying operation. By using such a gate input type amplifier, the high-speed amplifier MA1 is realized, thereby enabling the access time to be shortened. The amplifier MA2 is obtained by a latch circuit having an input gate constructed by the MOSFETs Q11 to Q17 similar to the example of FIG. 1. Since the amplifier MA2 has a margin for speed, a pass gate type amplification circuit similar to the above, which is capable of assuring an operation margin, is used. By such a combination, the access time is shortened under the device worst conditions, and a higher processing speed can be realized.

Figure 6:
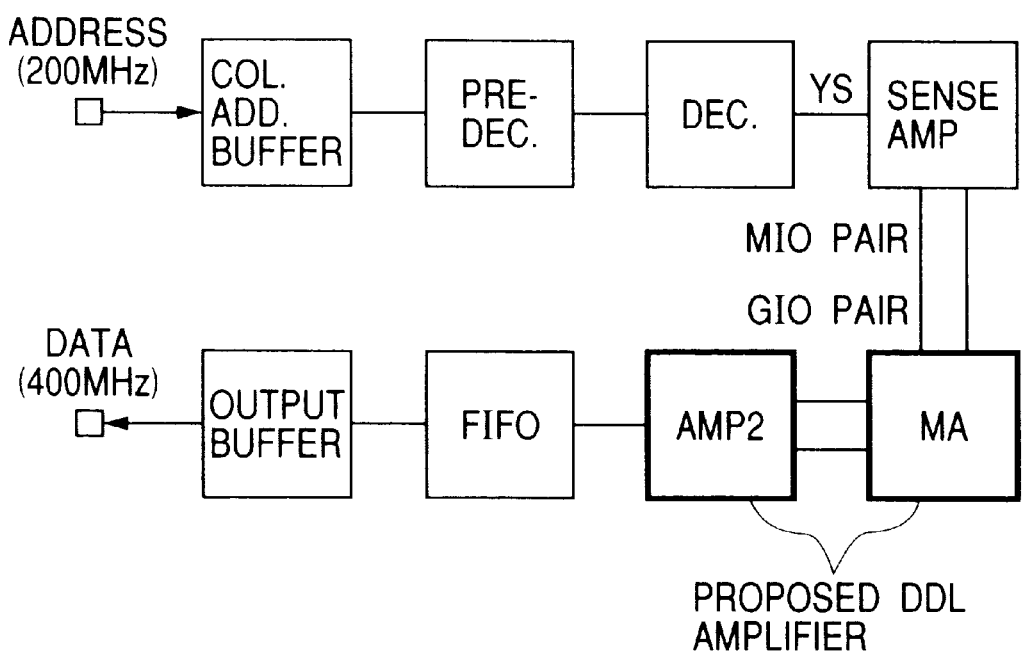
FIG. 6 is a block diagram showing another example of the amplification circuit according to the invention.

FIG. 6 is a block diagram showing another example of, an amplification circuit according to the invention. The example is characterized in that an output circuit having a latch circuit is provided at the post stage of the amplification circuit. Specifically, in the case of latching an output of the amplification circuit according to the invention by the front stage of an output buffer, whether the timing of receiving data is early or late is not known. Consequently, when the output circuit is adjusted for a late timing, the timing margin becomes excessive and a memory access delay occurs. To eliminate this inconvenience, circuits similar to the above are used as not only the main amplifier MA, but also an amplifier Amp2 at the front stage of the output buffer. By using the amplification circuit according to the invention also as the latch circuit Am2 at the next stage, the problem of a delay in access of the memory can be solved. The more the amplification circuit according to the invention is used in a signal transmission route, the more the timing margin can be optimized, so that the processing speed can be increased.

FIG. 6 shows blocks of a memory circuit indicating the operation path from reception of an address until output of data. A row address is received by a column address buffer and a column address is decoded by a predecoder. An output of the predecoder is decoded, thereby generating a selection signal YS. A sense amplifier which has completed an operation of amplifying a memory cell selected by a row selection circuit (not shown) is selected by the selection signal YS. An amplification signal of the sense amplifier is sent to a main amplifier (MA) via a pair of main input/output lines (MIO pair), and an amplifying operation by two-phase clocks is performed. An amplified signal is transmitted via a pair of global input/output lines (GIO pair) to the amplification circuit Amp2 and is amplified by two-phase clocks as in the main amplifier. The amplified signal is sent via an output selection circuit indicated by an FIFO to an output buffer and is outputted from a data terminal.

Figure 7:
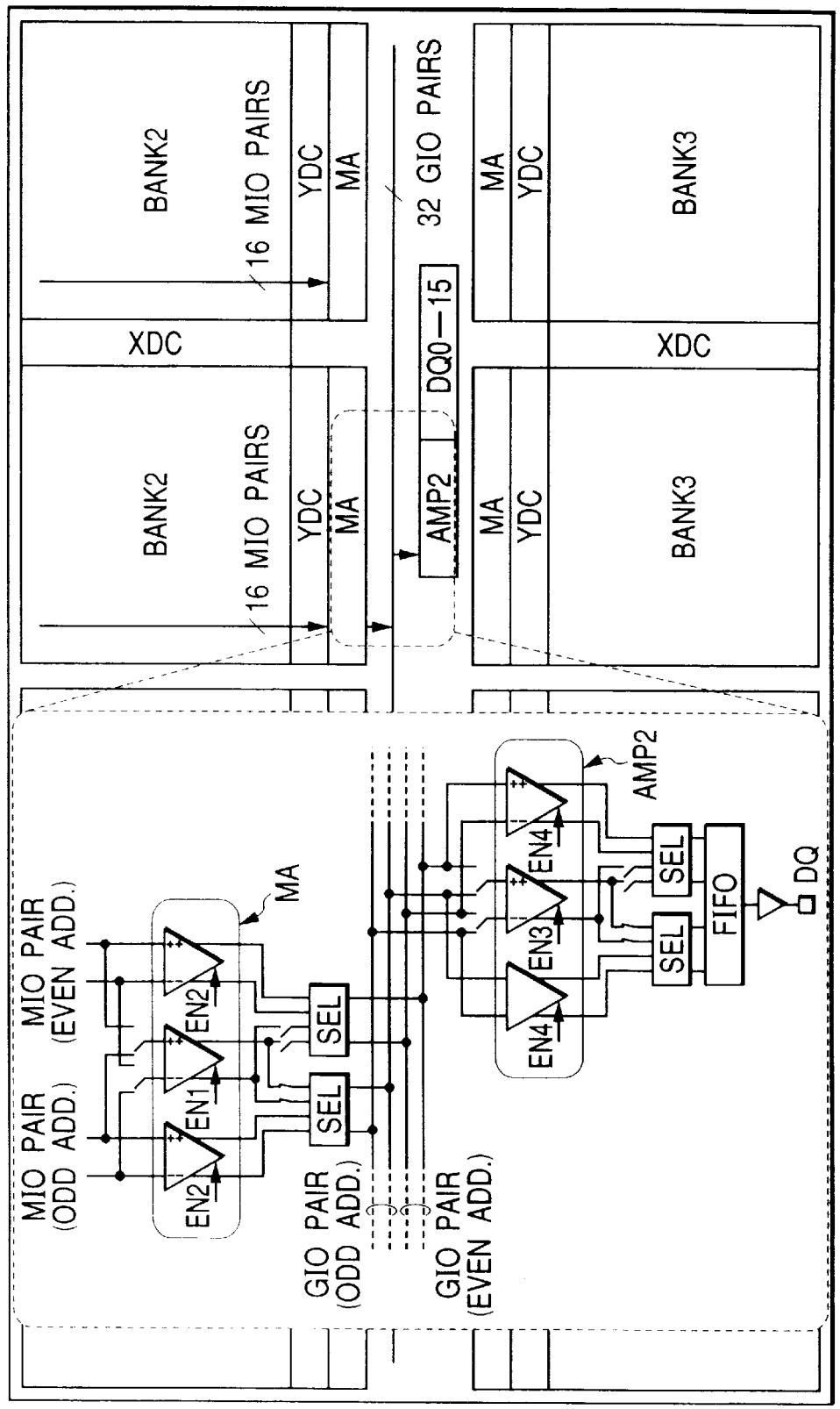
FIG. 7 is a diagram of the general configuration of a dynamic RAM for which the amplification circuit according to the invention is used.

FIG. 7 is a general configuration diagram of a dynamic RAM using the amplification circuit according to the invention. Although the invention is not so limited, the embodiment is directed to an SDRAM (Synchronous Dynamic Random Access Memory) which is formed on a single semiconductor substrate made of single crystal silicon or the like by a known technique of fabricating a semiconductor integrated circuit.

The SDRAM of the embodiment is obtained by dividing the chip into eight memory arrays. In FIG. 7, four memory arrays forming half of the SDRAM are shown as an example. In the right half of the drawing, an enlarged view of a portion related to the invention is shown. An X decoder XDC is provided along one end of a memory array. A Y decoder YDC and a main amplifier MA are disposed near to the center of the chip in the direction orthogonal to the X decoder XDC. The eight memory arrays are provided so as to be paired over the X decoders XDC symmetrically in the vertical direction. One memory bank (Bank2) is constructed by two memory arrays provided over the X decoder XDC. The other memory bank (Bank3) is similarly constructed by two memory arrays similar to the above.

In a memory array, a plurality of arrays arranged along word lines extending in the longitudinal direction .of the drawing from the X decoder XDC are provided. A hierarchical word line method of selecting a sub word line provided for each of the arrays by a sub word driver by using a main word line disposed so as to penetrate the plurality of arrays and a sub word line selection line is used. Similarly, the memory array has a plurality of arrays arranged along the Y selection line extending from the Y decoder YDC. The bit line is divided by the arrays.

The bit line is divided by sense amplifier lines provided on both ends of the bit line, and a local input/output line LIO is provided along the bit line. The local input/output line LIO is connected to the main input/output line MIO via a selection circuit selected by a row address. The main input/output line MIO will be described by using the memory bank Bank2 as an example. Sixteen pairs of the MIOs extend along the sub word driver in parallel with the Y selection line in each of the two divided memory arrays. Consequently, in one memory bank Bank2, thirty-two pairs of main input/output lines MIO are provided. In correspondence with the thirty-two pairs of main input/output lines MIS, thirty-two main amplifiers MA are provided.

Output signals of the thirty-two main amplifiers MA are supplied to thirty-two pairs of global input/output lines GIO extending in the vertical direction of the chip. The global input/output lines GIO extend in the vertical direction of the chip so as to be connected also to the main amplifiers MA provided in correspondence with two memory banks Bank0 and Bank2 (not shown) provided in the lower half of the chip.

Peripheral circuits are provided in the center portion of the chip. In FIG. 7, output circuits related to the invention are illustrated as examples of the peripheral circuits. The peripheral circuits include a row address buffer circuit and a column address buffer circuit for receiving an address signal in an address multiplex form, supplied from an address input terminal (not shown). The output circuits are an output buffer DQO-15 and an amplification circuit AMP2 provided at the front stage of the output buffer DQO-15. The output buffer DQO-15 is used to output data in parallel on the 16-bit unit basis. Thirty-two amplification circuits Amp2 are provided in correspondence with the global input/output lines GIO. At the output section of each amplification circuit Amp2, a selection circuit (FIFO) is provided to thereby transmit a 16-bit signal corresponding to an odd-number address or a 16-bit signal corresponding to an even-number address to the sixteen output buffers DQO to DQ15.

The amplification circuit of the embodiment has a problem in that its area is enlarged due to an increase in the number of latch circuits. As shown by an enlarged view in FIG. 7, the amplifier MA1 which operates by the clock in the first phase is shared by different main input/output lines MIO. The amplifier MA1 in accordance with the invention has the role of amplifying a signal at the highest speed under the device worst conditions. The amplifier MA1, therefore, can be shared by the following method.

Although the amplifier MA1 is not shared in normal times, when an amplification is necessary for a parallel test, the amplifier MA1 can be shared. Since the parallel test does not require high speed, it is sufficient to set a low operation frequency so that the amplifiers MA1 and MA2 coincide with each other even under the device best conditions. In this case, it is sufficient to connect the main amplifier MA1 to one of the main input/output lines MIO. Alternately, the generation of the operation timing signal EN1 may be inhibited.

In one memory bank Bank2, the main input/output lines MIO are designated for an odd-number address and an even-number address in the two memory arrays. In a regular reading operation, eight bits are selected from each of the memory arrays in correspondence with a column address signal, and 16-bit data is outputted by using half of the global input/output lines GIO (for the odd-number or even-number address). At this time, only sixteen main amplifiers MA out of the thirty-two main amplifiers MA operate. By selecting the amplifiers which operate in response to the clock EN1 in the first phase by using the column address signal, the amplifier can be shared by the clock EN2 in the second phase.

In a test operation, the column address signal for selecting the main input/output line MIO is made invalid, data of 16 bits is selected from each of the memory arrays so as to simultaneously read data of 32 bits from each memory bank and is supplied to a test circuit (not shown), and whether to outputs coincide with each other or not is detected, thereby shortening the test time. In such a test operation, it is sufficient to set a low clock frequency, and assure a sufficient signal amount also for the amplifier which operates by the clock EN2 in the second phase. Consequently, it is unnecessary to make two main amplifiers MA operate at different timings. In such a manner, the area of the main amplifiers can be reduced.

In the case where the amplification circuit Amp2 is provided for the input section of the output circuit and is operated by the two-phase clocks, by the selecting operation as described above, only sixteen main amplifiers Amp2, representing half of the thirty-two amplifiers Amp2, are operated. Therefore, by selecting amplifiers which operate in response to the clock EN3 in the first phase by using the column address signal, the amplifiers can be shared by the clock EN4 in the 2econd phase.

The idea of using the amplifiers operated in the first phase also as those operated in the second phase makes it possible that amplifiers can be shared by odd-number and even-number addresses in the DDR operation in the SDRAM. To be specific, in a main amplifier MA for amplifying a signal on the main input/output line MIO of a start address outputted synchronously with the rising edge of a clock signal, the signal is outputted at high speed by using the amplifier operated by the clock EN1 in the first phase. In the main amplifier MA for amplifying the signal of the main input/output line MIO to be outputted at the trailing edge of the clock signal, that is, after elapse of a half cycle, since there is enough time to assure the input signal amount, only the amplifiers operated by the clock EN2 in the second phase can be used.

For a similar reason, the amplifiers operated by the clock in the first phase can be shared by banks. Specifically, in the case of sequentially outputting read signals from a plurality of banks, as the main amplifier MA for amplifying the signal of a bank to be outputted first synchronously with the clock signal, the amplifier MA1 operated by the clock EN1 in the first phase is used. As the main amplifies for amplifying a signal from a bank to be selected in the next cycle, the amplifier MA2 operated by the clock EN2 in the second phase may be used.

Figure 8:
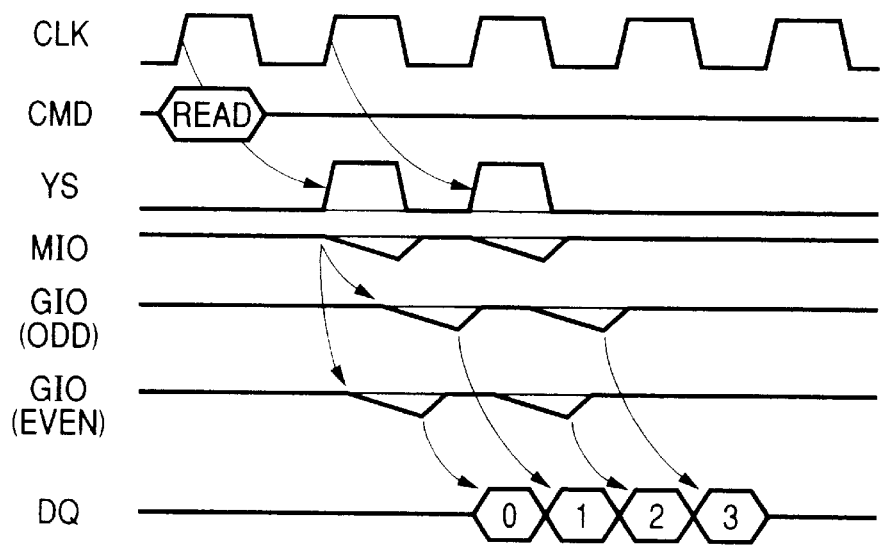
FIG. 8 is a timing chart for explaining a DDR mode of an SDRAM to which the invention is applied.

FIG. 8 is a timing chart for explaining a DDR mode of an SDRAM to which the invention is applied. In this case, the amplifier MA1 operated in the first phase is shared by odd-number and even-number addresses in the DDR operation. Specifically, in the case where a start address is an even number in odd-number and even-number addresses assigned to the main input/output lines MIO, a read signal to be transmitted through the main input/output line MIO of the even-number address has to be read at high speed. Consequently, the signal is outputted by using the amplifier MA1 operated by the clock EN1 in the first phase.

The address of a signal of the line outputted in the second cycle is accordingly an odd number. Since there is a margin in access time by an amount of the half clock, the read signal transmitted to a main input/output line MIO of an odd-number address is amplified at a late timing by the amplifier MA2 which operates in response to the clock EN2 in the second phase. The output signals are transmitted to the output circuit via the odd-number and even-number global input/output lines GIO and amplified by the amplification circuit Amp2. In the output unit of the amplification circuit Amp2, the even-number and odd-number addresses are alternately selected in accordance with changes to the high and low levels of the clock signal CLK and data is serially outputted like 0, 1, 2, 3, . . . . At this time, the control circuit CTP for controlling the operation of the amplifier MA2 corresponding to the odd-number address outputted after elapse of the half clock is turned off. Thus, an increase in area, therefore, can be minimized without causing an access delay.

Figure 9:
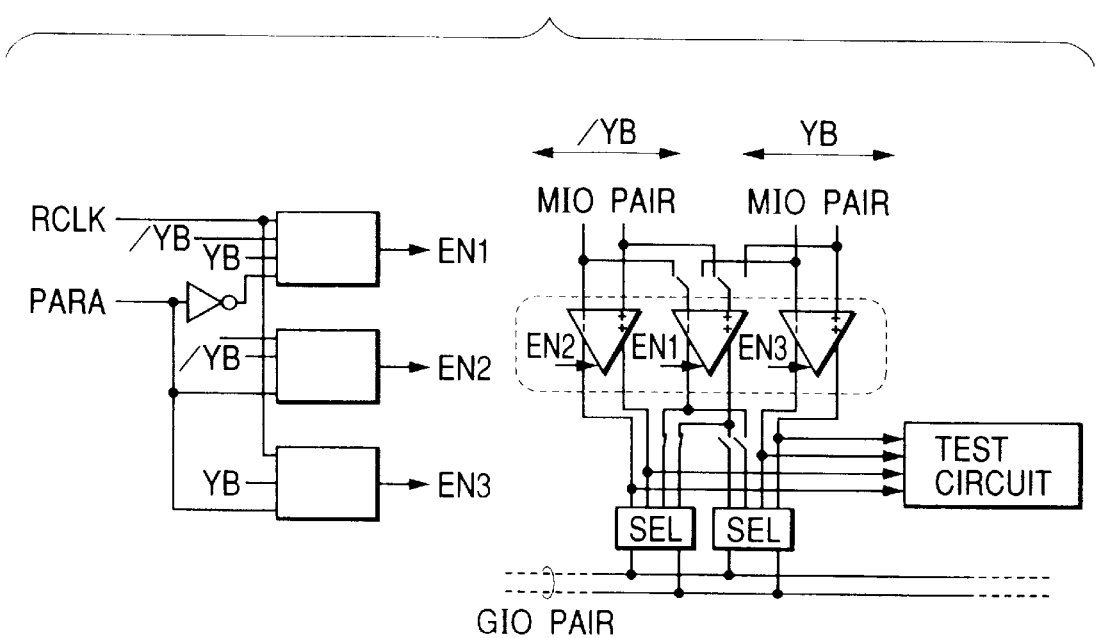
FIG. 9 is a schematic diagram illustrating a test mode of the SDRAM to which the invention is applied.

FIG. 9 is a configuration diagram for explaining a test mode of the SDRAM to which the invention is applied. In the embodiment, an example of using the amplifier MA1 which operates in response to the clock EN1 in the first phase as main amplifiers provided for a parallel test is shown. Specifically, in normal operation, a signal is outputted from one of the pair of main input/output lines MIO on the basis of a column address Y8. It is therefore sufficient to operate the main amplifier corresponding to the signal. In such normal operation, the two main amplifiers are not simultaneously operated. Consequently, the amplifier MA1 can be used as an amplifier selected by the address Y8.

At the time of a parallel test (PARA=logic 1), the timing signals EN2 and EN3 are generated when a signal PARA goes high to make the addresses Y8 and /Y9 invalid. Specifically, the timing signals EN2 and EN3 are generated when the signal PARA goes high so as to simultaneously output read signals from two main input/output lines MIO and supplied to a test circuit for determining whether the signals coincide with each other or not. At the time of the parallel test, it is unnecessary to operate the circuit at high speed. Consequently, only the amplifier MA2 operated by the clocks EN2 and EN3 in the second phase can be made operative and output the result. Generation of the clock EN1 for the amplifier MA1 which operates in response to the clock in the first phase is stopped when the signal PARA has the logical value of "1", and the amplifier MA1 is made inoperative.

Figure 10:
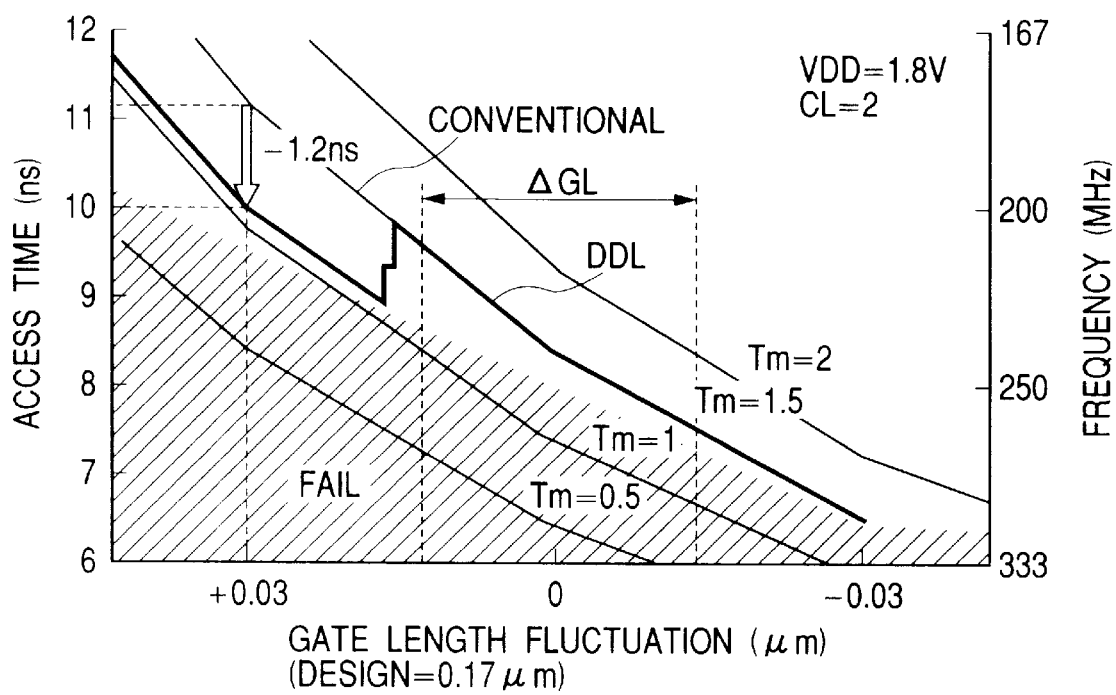
FIG. 10 is a characteristic diagram illustrating the relation between fluctuation in gate length of an MOSFET and access time in the operation of the invention.

FIG. 10 is a characteristic diagram for explaining the relation between the gate length fluctuation of the MOSFET and the operating speed. When the gate length of an MOSFET fluctuates due to device process variations, a threshold voltage Vth, a drain-source current Ids, and the like fluctuate, and the internal operation is affected. Therefore, the timing of an internal signal largely fluctuates. When the timing margin is assured in the device best case, the timing margin becomes excessive in the device worst case, and access is delayed (as shown by "Conventional" in the diagram).

By applying the method, in the device worst case as shown by the characteristic Tm=1, the circuit operates with the optimum margin. When the characteristic Tm is maintained to be 1, however, the margin becomes insufficient in the device best case. Tm is changed to 1.5, and the circuit is operated at a slow timing to assure a timing margin. Specifically, by using the characteristic of the double data latch DDL, variations in the device process from +0.03 to −0.03 with respect to the gate length design value of 0 as a center can be cancelled. Since the operation of the amplifier MA2 in the second phase having the characteristic Tm of 1.5 is regulated in the device worst case, an operation frequency of about 200 MHz can be realized even in the device worst case.

Figure 11:
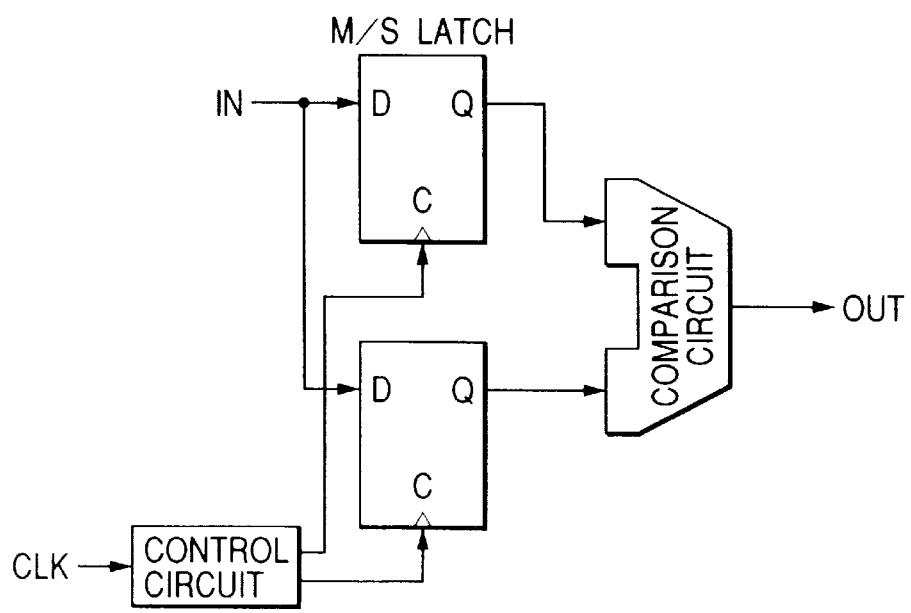
FIG. 11 is a block diagram showing another embodiment of the invention.

FIG. 11 is a block diagram of another embodiment of the invention. In the embodiment, the invention is applied to a logic circuit. In the logic circuit, a master latch circuit and a slave latch circuit are used. In such latch circuits as well, a timing margin (setup/hold) is necessary. Particularly, in a system LSI (large-scale integrated circuit), in many cases, a plurality of circuit functions are combined to form a desired data processing system. When all of the circuit functions are not designed by a company, but setup data of a specific circuit function such as a memory circuit is obtained from another company, or, on the contrary, a circuit function block designed by a company is given to another company, semiconductor integrated circuit devices are formed by different fabricating techniques, different fabrication facilities, and the like.

From the viewpoint of circuit design, conventionally, it is sufficient to evaluate the characteristics of a device on the basis of the fabricating technique or fabricating facilities of its company and design the circuit within the process variation range. In the case of selling the setup data to another company, however, it is also necessary to make sure that a circuit fabricated by a different fabricating technique and different fabricating facilities operate stably. Consequently, the circuit design based on the conventional idea cannot deal with a circuit in which circuit data as a part of a semiconductor integrated circuit device is bought or sold. That is, a circuit capable of dealing with process variations more than ever and even unknown process variations is required. By assembling the amplification circuit according to the invention in a logic circuit or the like of design data (in the IP) of the specific circuit function, an IP capable of allowing a wider range of device variations can be realized.

Figure 12:
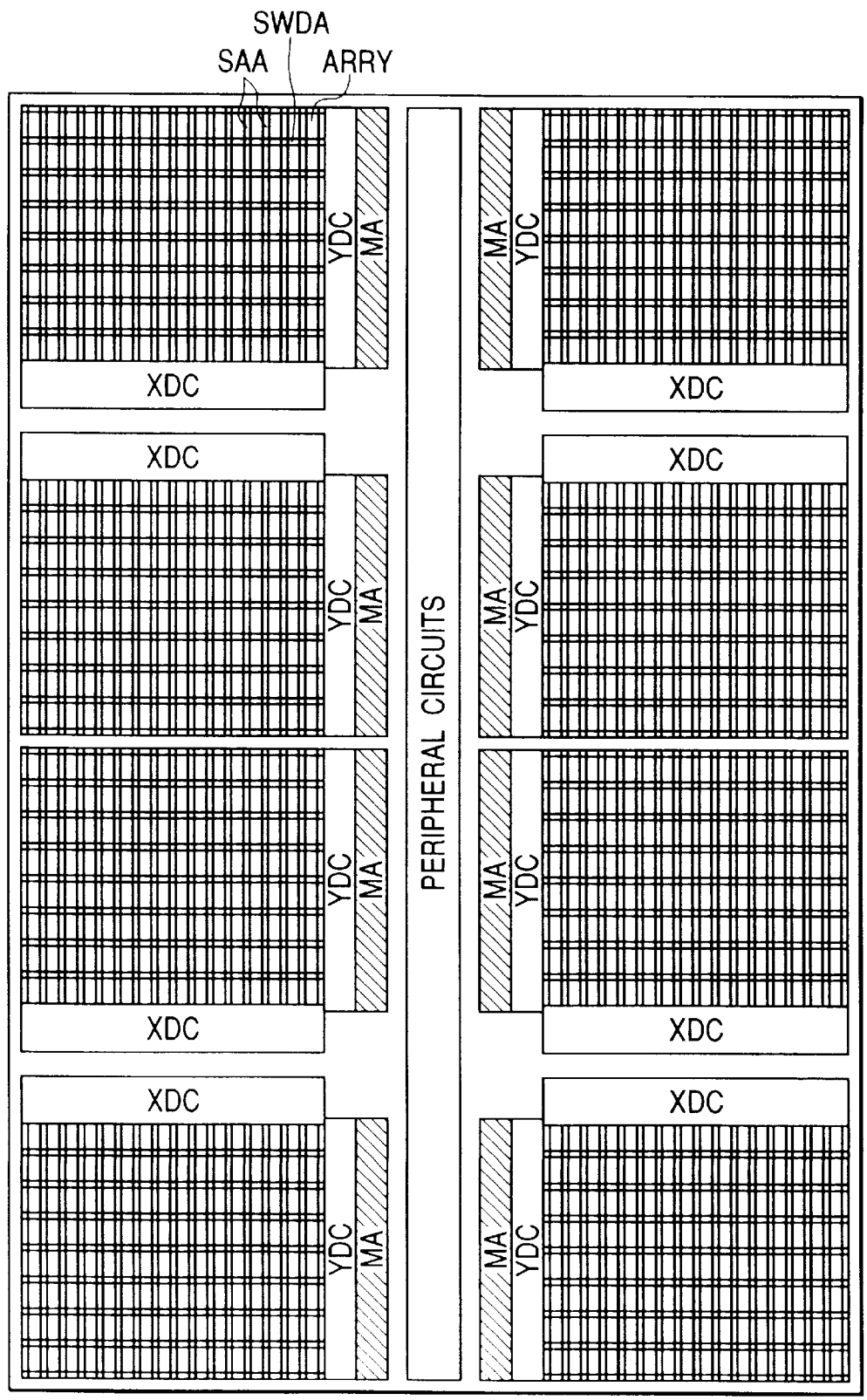
FIG. 12 is a diagram showing the general configuration of a chip as an embodiment of the semiconductor storage according to the invention.

FIG. 12 is a diagram showing the overall configuration of a chip as an example of the semiconductor storage according to the invention. Although the invention is not so limited, the semiconductor storage of the embodiment is directed to an SDRAM (Synchronous Dynamic Random Access Memory) and is formed on a single semiconductor substrate made of single crystal silicon or the like by a known technique of fabricating a semiconductor integrated circuit. FIG. 12 corresponds to the embodiment of FIG. 7.

The SDRAM of FIG. 12 is obtained by dividing a chip into eight blocks so as to derive a plurality of memory blocks and banks. The eight blocks obtained by dividing the chip have configurations similar to each other. In each of the blocks, an X decoder XDC is provided along one end of a memory array, and a Y decoder YDC and a main amplifier MA are disposed near to the center of the chip in a direction orthogonal to the direction of the X decoder XDC. The eight memory blocks are paired and disposed symmetrically in the vertical direction so that the X decoders are disposed adjacent to each other, thereby forming one memory bank. Two memory banks each having two pairs of memory blocks are also disposed symmetrically in the vertical direction. The memory banks are disposed so that the Y decoders YDC and the main amplifiers MA are adjacent to each other over the peripheral circuits provided in the center in the vertical direction.

A memory array in each memory block employs a hierarchical word line method of selecting one of a plurality of arrays "Arry" provided along word lines extending in the vertical direction from the X decoder and a sub word line provided for each of the arrays by using a main word line extending through the plurality of arrays and a sub word line selection line. By employing this method, the number of memory cells connected to the sub word line can be reduced, and the sub word line selecting operation is performed at higher speed.

Similarly, the memory array has a plurality of arrays "Arry" arranged along the Y selection lines extending from the Y decoder YDC. The bit line is divided by the arrays. Consequently, the number of memory cells connected to the bit line is reduced, and a signal voltage read from a memory cell onto a bit line is assured. The memory cell is a dynamic type memory cell. Whether a storage capacitor is charged or not is represented by information of "1" or "0". A reading operation is performed by charge coupling between the charge of the storage capacitor and a precharging charge of the bit line. By reducing the number of memory cells connected on the bit line, a necessary signal amount can be assured.

Sub word drivers SWDA are disposed on the upper and lower sides of the arrays "Arry", and sense amplifier lines SAA are disposed on the right and left sides of the arrays "Arry In the sense amplifier line SAA, a column selection circuit, a bit line precharge circuit, and the like are provided. A small potential variation appearing on each bit line when data is read from a memory cell by selection of a word line (sub word line) is detected and amplified by the sense amplifier SA.

Although the invention is not so limited, the main input/output line MIO extends in the lateral direction on the sub word driver lines SWDA, as shown in the diagram. A local input/output line LIO is disposed along the sense amplifier line SAA, the local input/output line LIO and the main input/output line MIO are connected by a row selection signal. In the peripheral circuit, the global input/output lines GIO are disposed and connected to the main input/output line MIO corresponding to the selected memory bank.

Although not shown, a peripheral circuit to be described hereinbelow is property provided in the center portion of the chip. An address signal supplied from the address input terminal is received in an address multiplex form by a row address buffer circuit and a column address buffer. The supplied address signal is held by each address buffer. For example, each of the row address buffer and the column address buffer holds the received address signal for one memory cycle. In the center portion of the chip, a repair circuit including a fuse, an MOSFET for performing address comparison, and the like are also provided.

In a refresh operation mode, the row address buffer receives a refresh address signal outputted from the refresh control circuit as a row address signal. In the embodiment, although the invention is not so limited, the refresh address signal is received as a row address signal via the clock generating circuit. The address signal received by the column address buffer is supplied as preset data to a column address counter included in the control circuit. The column address counter outputs a column address signal as preset data or a column address signal sequentially incremented toward the Y decoder YDC in accordance with an operation mode designated by a command which will be described hereinlater. Although the invention is not so limited, to the control circuit external control signals such as a clock signal, a clock enable signal, a chip select signal, a column address strobe signal, a row address strobe signal, a write enable signal, and a data input/output mask control signal, and an address signal corresponding to the memory bank are supplied. On the basis of a change in level of each of these signals, timings, and the like, various control signals of operation modes of the SDRAM and the like and various timing signals corresponding to the control signals are generated. A control logic and a mode register for the signals are provided.

The high level of the chip select signal (chip not-selected state) and other inputs does not mean anything. The selection state of a memory bank and internal operations, such as a burst operation, are not influenced by a change to the chip non-selected state. The column address strobe signal, row address strobe signal, and write enable signal have functions different from those of the corresponding signals in an ordinary DRAM and are significant signals to define a command cycle.

Figure 13:
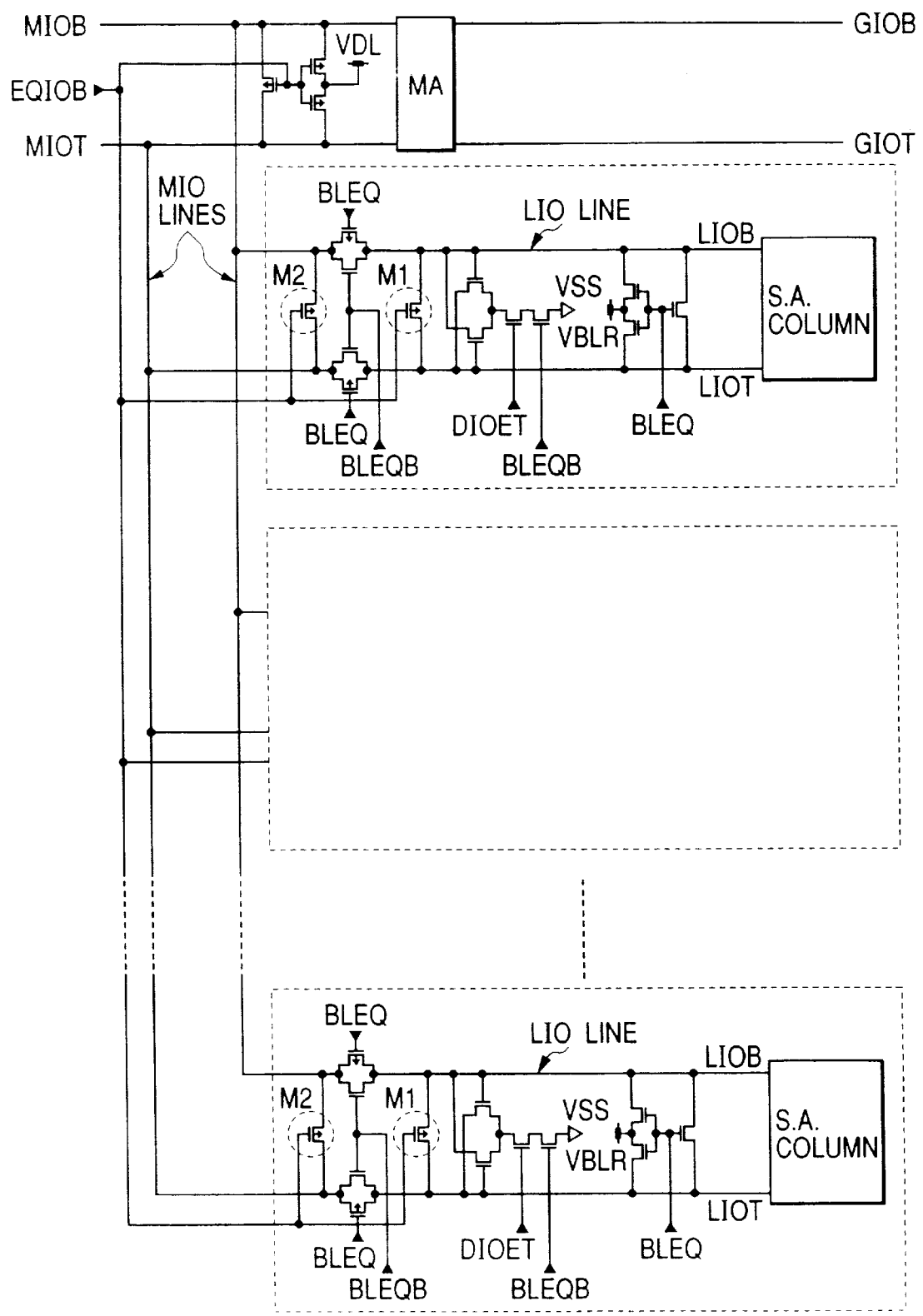
FIG. 13 is a schematic circuit diagram showing the main portion of an SDRAM to which the invention is applied.

FIG. 13 is a circuit diagram showing the main portion of the SDRAM to which the invention is applied, and it will be used to explain the embodiment of FIG. 7 more specifically. A local input/output line (hereinbelow, called an LIO line) extended along the sense amplifier (SA) line is connected to the MIO line via a selection circuit provided at a portion where the LIO line is connected to the main input/output line MIO (hereinbelow, called an MIO line) The selection circuit connects the LIO line corresponding to the sense amplifier line of the array "Arry" corresponding to the word line selected by row selection signals BLEQ and BLQB.

The LIO line is provided with a sub amplifier constructed by a differential MOSFET and an MOSFET for controlling the operation timing of the differential MOSFET. By the sub amplifier, a signal amplified by the sense amplifier SA is received and an operation of amplifying signals transmitted to the LIO and MIO lines is performed. In the embodiment, although the invention is not limited, short-circuiting MOSFETs M1 and M2 are provided on both sides of the selection circuit corresponding to each of the arrays. The gates of the short-circuiting MOSFETs M1 and M2 are commonly connected to the gates of short-circuiting MOSFETs M1 and M2 corresponding to another array similarly provided. A precharge signal EQIOB is supplied to the gates to also turn on the short-circuiting MOSFET M1 on the LIO line of a not-selected array. In the not-selected LIO line, the short-circuiting MOSFET M1 on the LIO line side performs an operation as a short-circuiting MOSFET of a precharge voltage VBLR corresponding to the half precharge voltage of a bit line.

On the not-selected LIO line, the short-circuiting MOSFET M2 on the MIO line side operates as a short-circuiting MOSFET on the MIO line and, therefore, acts so that at least the same potential is obtained in the precharge period of the MIO line. The output terminals of the main amplifier MA are connected to the global input/output lines GIOT and GIOB (hereinbelow, called GIO lines). In the case of accessing a memory on a 16-bit unit basis, as the GIO lines, sixteen pairs of signal lines are provided. In the DDR, thirty-two pairs of signal lines are provided. The GIO lines may be also provided with sub amplifiers in a manner similar to the LIO line.

The main input/output line MIO has a relatively long interconnection distance, so that the parasitic capacity value is relatively large. The line capacity of the main input/output line MIO or the like is relatively stable as compared with the device characteristics against the influence of process variations. That is, the transmission speed of a signal transmitted through the input/output line MIO is relatively stable. Strictly, although the amplifying operation of the main amplifier MA is influenced by the input signal amount itself and process variations, it can be regarded as almost constant as compared with large process variations in device characteristics of an MOSFET. Consequently, by setting the amplifiers MA1 and MA2 and their operation timings in consideration of the process variations in device characteristics, a desired operation can be realized.

Figure 14A:
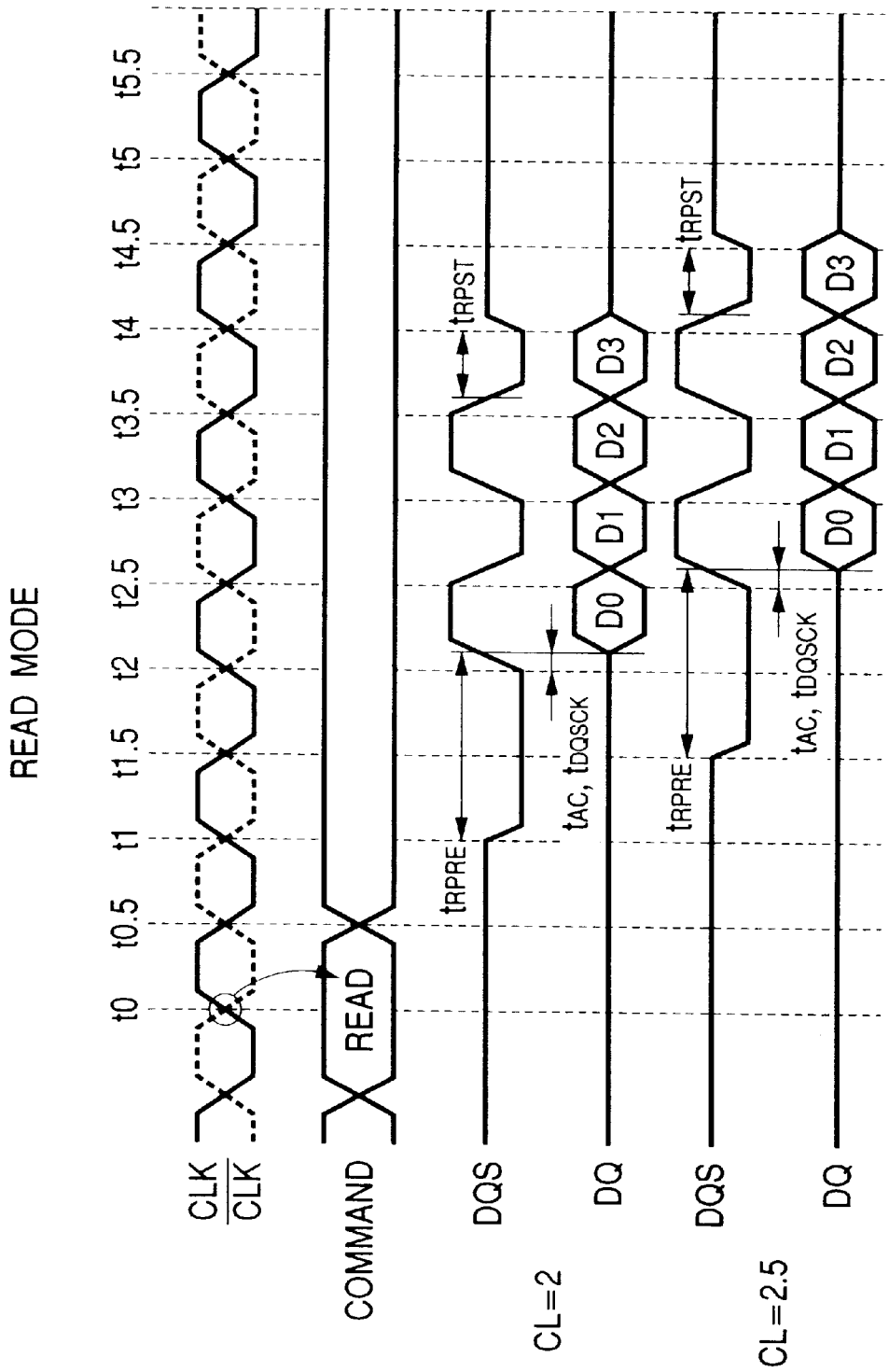
FIGS. 14A and 14B are timing charts illustrating an example of the operation of the SDRAM to which the invention is applied.
Figure 14B:
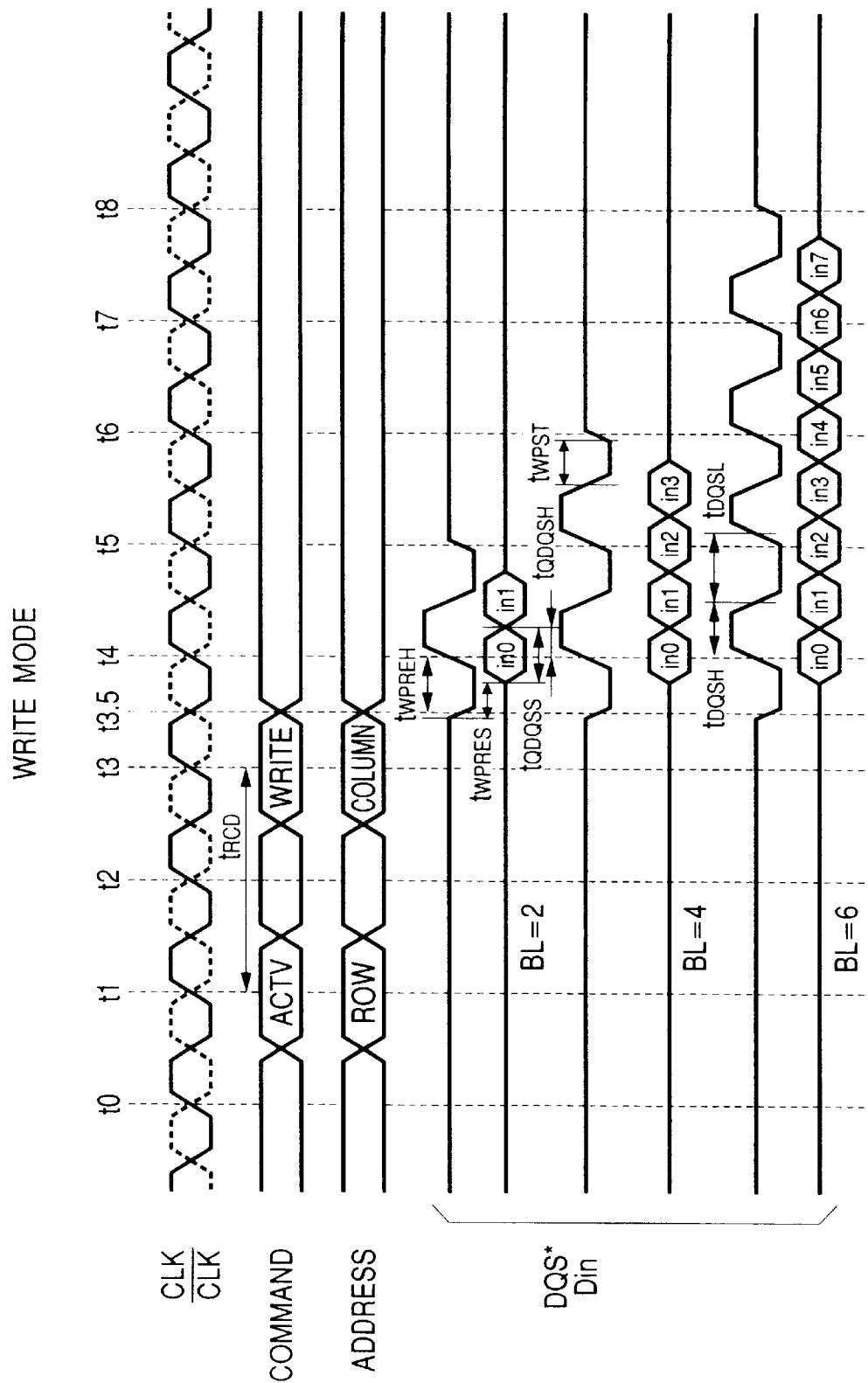

FIGS. 14A and 14B show timing charts for explaining an example of the operation of the SDRAM to which the invention is applied. FIG. 14A shows an example of the read mode, and FIG. 14B shows an example of the write mode. As shown in FIGS. 14A and 14B, in a synchronous DRAM of a DDR to/from which data is input (written)/output (read) synchronously with change timings of the rising and trailing edges of a clock signal CLK (/CLK), the precharging operation has to be performed in the half cycle of the clock signal CLK, so that it is very significant to provide short-circuiting MOSFETs M1 and M2 as described above.

In the case where a high clock frequency is set and the DDR operation as described above is performed, the high processing speed is disturbed by the assurance of the precharge period of the MIO and LIO lines. However, by a simple configuration of providing short-circuiting MOSFETs on both sides of the selection signal for connecting the MOS and LIO lines, the problem can be solved. By using the two-phase clocks as the amplification circuit constructing the main amplifier MA, high speed operation can be carried out without being influenced by process variations.

Figure 15:
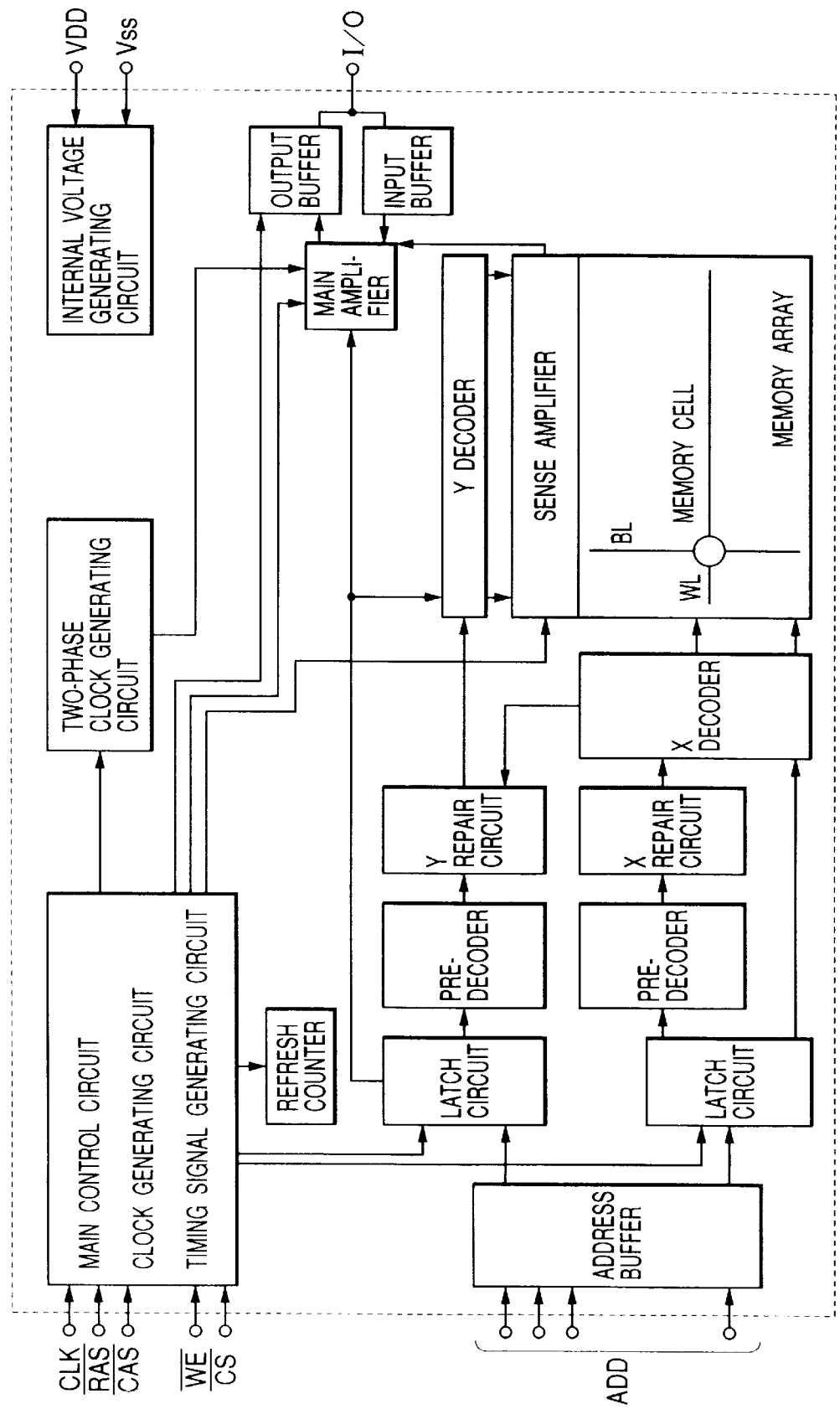
FIG. 15 is a general block diagram showing a dynamic RAM as an embodiment of the invention.

FIG. 15 is a block diagram showing a dynamic RAM according to an embodiment of the invention. Control input signals include a row address strobe signal /RAS, a column address strobe signal /CAS, a write enable signal /WE, and an output enable signal /OE. Here, /denotes an over bar of the logical symbol indicating that the low level is an active level. An X address signal and a Y address signal are time sequentially entered from common address terminals Add synchronously with the row address strobe signal /RAS and the column address strobe signal /CAS.

The X address signal and the Y address signal supplied via the address buffer are latched by latch circuits. The X address signal latched by the latch circuit is supplied from a predecoder as described above, an output signal of the predecoder is supplied to an X decoder, and a selection signal of the word line WL is generated. By the operation of selecting the word line, a read signal as described above appears on a complementary bit line of the memory array, and an amplifying operation is performed by a sense amplifier. The Y address signal latched by the latch circuit is supplied to a predecoder as described above, an output signal of the predecoder is supplied to a Y decoder, and a signal of selecting the bit line DL is generated. An X repair circuit and a Y repair circuit store an address of a defective cell, compare the stored address of the defective cell with the latched address signal, and, when they coincide with each other, instruct selection of a spare word line or bit line to the X decoder and Y decoder, and inhibit an operation of selecting the regular word line or regular bit line.

The storage information amplified by the sense amplifier is selected by a column switch circuit (not shown) connected to a common input/output line, and supplied to the main amplifier. The main amplifier includes two latch circuits which operate in response to clock signals generated by a two-phase clock generating circuit. The main amplifier is provided with a write circuit, although the invention is not so limited. Specifically, in the reading operation, a read signal read via a Y switch circuit is amplified, and an amplified signal is outputted from an external terminal I/O via an output buffer. In the writing operation, a write signal supplied via the external terminal I/O is received via the input buffer and is transmitted to a common input/output line and a selection bit line via the write circuit. The write signal is sent to the selection bit line by the amplifying operation of the sense amplifier, and a corresponding charge is held in the capacitor of the memory cell.

A clock generating circuit (main control circuit) generates various timing signals necessary for the operation of selecting a memory cell, such as a control timing signal for latching address signals supplied in response to the signals /RAS and /CAS and a timing signal of the operation for the sense amplifier. An internal voltage generating circuit receives operation voltages, such as Vcc and Vss, supplied from the power source terminal and generates various internal voltages, such as the plate voltage, a precharge voltage, such as Vcc/2, an internal boost voltage VCH, an internal drop voltage VDL, and a substrate back-bias voltage VBB. A refresh counter generates an address signal for refresh to select an X address when the circuit enters a refresh mode.

Figure 16:
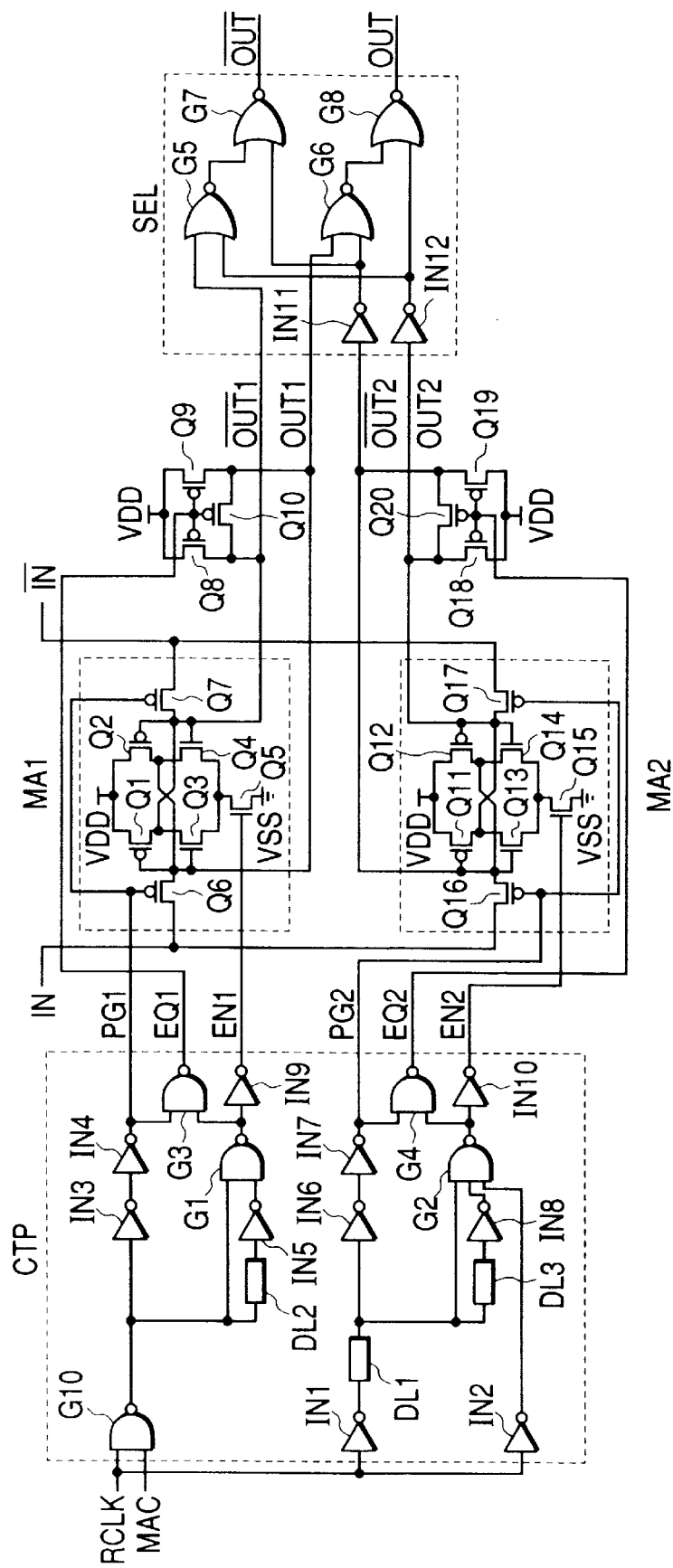
FIG. 16 is a schematic circuit diagram showing another example of an amplification circuit used in a semiconductor integrated circuit device according to the invention.

FIG. 16 is a circuit diagram showing another example of the amplification circuit for use in the semiconductor integrated circuit device according to the invention. Although the invention is not so limited, the amplification circuit of the embodiment is directed to a logic circuit of design data (in the IP) of the specific circuit function. In the case where the circuit is designed by different processes as described above, in fabrication by a process of the variation of which is stable in a narrow range, it is unnecessary to operate the amplifiers MA1 and MA2 obtained by connecting two latch circuits in parallel. Specifically, when the gate length fluctuation $\Delta GL$ is within a predetermined range, as shown by broken lines with respect to the design value of 0 as a reference in FIG. 10, it is unnecessary to switch the characteristic Tm of 1.5 (conventional technique) obtained by using the amplifier MA2 to the characteristic Tm of 1 for higher processing speed in correspondence with the process worst conditions.

That is, when the gate length fluctuations according to a fabricating technique or a fabricating apparatus is within the range of $\Delta GL$, the fluctuation can be compensated by the amplifying operation of the amplifier MA2, which operates in response to a clock in the second phase it makes the existence of the amplifier MA1 unnecessary, which operates erroneously in response to the clock of the first phase. In the embodiment, a terminal MAC is provided and a function of inhibiting the operation of the amplifier MA1 by a-control signal supplied to the terminal MAC is added. To be more specific, the clock signal RCLK is sent via a gate circuit GIO to a circuit as a component of a control circuit for controlling the operation of the amplifier MA1 in the first phase. The transmission of the clock RCLK of the gate GIO is regulated by the terminal MAC.

Specifically, in the semiconductor integrated circuit device in which the gate length fluctuation is compensated so as to be within the range of AGL, a low level signal (logic 0) is fixedly supplied to the terminal MAC, and an output signal of the gate circuit GIO is fixed to the high level irrespective of the clock signal RCLK. Consequently, the signal PG1 is fixed at the high level, the signal EN is fixed at the low level, and the signal EQ1 is fixed at the low level. When the signal PG1 goes high, the p-channel MOSFETs Q6 and Q7 are turned off, thereby inhibiting latching of the input signals IN and /IN. When the signal EN1 goes low, the MOSFET Q5 is turned off so that the operation current is not passed to the latch circuit. When the signal EQ1 goes low, the MOSFETs Q8 and Q9 are turned on, and the outputs OUT1 and /OUT1 are equalized to the high level (VDD).

The level of the terminal MAC can be set in correspondence with a probe test of a semiconductor integrated circuit device. In consideration of a change with time of the device, temperature change, and power supply fluctuation, when the operation can be performed only by an amplifier which operates in response to the clock in the second phase, the level can be set in a probing process.

The level setting of the terminal MAC may be determined by entering fabricating parameters. Specifically, when the fabricating technique and facilities guarantee the gate length fluctuation range AGL, the terminal MAC is set to the low level. When $\Delta GL$ is not guaranteed, the terminal MAC is set to the high level. The process worst conditions and the process best conditions may be applied to a circuit as shown in the embodiment of FIG. 11 and associated not with variations in the specific fabricating technique and the fabricating facilities as in the conventional technique, but with the technical levels in the semiconductor industry. In the case of dealing with the circuit design data as a commodity, the circuit designing method according to the invention is effective.

The effects produced by the embodiments are as follows.
(1) The selection circuit is provided for the first and second latch circuits which operate in response to the first and second operation timing signals. The selection circuit is allowed to perform the first operation of transmitting a signal corresponding to the first output signal of the latch circuit to the third output terminal; and, when the first output signal and the second output signal of the second latch circuit are different from each other, it is allowed to perform the second operation of transmitting the second output signal in place of the first output signal to the third output terminal. The second operation timing signal is generated behind the first operation timing signal, and the operation period of the second latch circuit is made shorter than an operation period of the second operation timing signal in accordance with either the operation frequency or a signal of coincidence between the first and second output signals in the first operation. In such a manner, a high processing speed and an improved operation margin even under the process worst conditions can be realized.
(2) In addition, by providing each of the first and second input terminals with switching means for capacitively isolating a signal line for transmitting the input signal in an operation period of the first and second latch circuits in response to the first and second operation timing signals, the load on the latch circuit is lessened and a high speed amplifying operation can be realized.

(3) In addition, the first output terminal is provided with a first recharge circuit which is operated by a first precharge signal generated in response to completion of the operation of the first latch circuit, and the second output terminal is provided with a second precharge circuit which is operated by a second precharge signal generated in response to completion of the operation of the second latch circuit; and, when the first precharge signal is preceding to an ending timing of the second operation timing, the second operation timing signal is finished by the first precharge signal. By this operation, a rational operation adapted to a practical operation can be carried out.

(4) In addition, complementary signals are sent to the first to fourth input terminals and the first to third output terminals, and each of the first and second latch circuits is constructed by a pair of CMOS inverter circuits having input and output terminals which are connected so as to cross each other, and first and second switching MOSFETs for receiving the first and second operation timing signals and passing an operation current to the CMOS inverter circuits. Thus, with a simple configuration, the operation can be performed at high speed.

(5) In addition, a plurality of the input signals are successively transmitted in response to clock signals, and the first and second operation timing signals are set in response to the clock signals, such that successive data can be read at high speed.

(6) In addition, by providing an output circuit having a latching function including a pair of latch circuits corresponding to the first and second latch circuits on an output side of the selection circuit, a signal to be transmitted can be efficiently outputted at high speed.

(7) In addition, storage information in a plurality of memory cells provided in correspondence with a plurality of word lines and a plurality of complementary bit line pairs is amplified by a sense amplifier as a first amplification circuit, read and outputted to a first common complementary pair via a first selection circuit, selected by a second selection circuit, and transmitted to a second common complementary pair. The read signal from the memory cell transmitted to the second common complementary pair is amplified as the input signal. Consequently, signals from a memory having a large capacity can be outputted at high speed with, moreover, a necessary operation margin.

(8) In addition, by successively sending a plurality of input signals at both a rising edge and a trailing edge of a clock signal, a reading operation can be performed at high speed.

(9) In addition, by further providing a circuit for always inhibiting an operation of generating the second operation timing signal, low power consumption can be realized while improving the operability is produced.

(10) In addition, by using an input signal supplied to the first input terminal of the first latch circuit as an amplification signal generated by a differential amplification circuit, high processing speed in the device worst case can be achieved.

(11) First to third latch circuits are assigned in correspondence with two serial outputs, two latch circuits and a selection circuit are used according to a signal to be outputted first, when output signals of the two latch circuits are different from each other, an output signal of the latch circuit which operates behind is allowed to be outputted in place of the output signal of the latch circuit which operates in advance, and an output signal generated by the other latch circuit is used as the signal to be outputted later. Thus, an amplification circuit which operates at high speed and has an improved operation margin can be obtained while achieving a simplified circuit configuration.

(12) In addition, by providing each of the first to third input terminals with switching means for capacitively isolating a signal line for transmitting the input signal in an operation period of the first to third latch circuits in response to the first to third operation timing signals, the load on the latch circuit is lessened and an amplifying operation can be performed at high speed.

(13) In addition, an output circuit shared by the first and second selection circuits is provided. The first and second input signals are supplied at the same timing, in a first state of the first operation mode, a first output signal corresponding to the first input signal is outputted from the output circuit, and, after that, a second output signal corresponding to the second input signal is outputted from the output terminal. In a second state of the first operation mode, the second output signal corresponding to the second input signal is outputted from the output circuit, and, after that, the first output signal corresponding to the first input signal is outputted from the output circuit. Consequently, a simplified circuit can be achieved.

(14) In addition, the first output terminal is provided with a first precharge circuit which is operated by a first precharge signal generated in response to completion of the operation of the first latch circuit, the second output terminal is provided with a second precharge circuit which is operated by a second precharge signal generated in response to completion of the operation of the second latch circuit, the third output terminal is provided with a third precharge circuit which is operated by a third precharge signal generated in response to completion of the operation of the third latch circuit. When the third precharge signal precedes the ending timing of the first operation timing signal in the first state in the first operation mode, the first operation timing signal is finished by the third precharge signal. When the third p r6charge signal precedes an ending timing of the second operation timing signal in the second state in the -first operation mode, the second operation timing signal is finished by the third precharge signal. Thus, a rational circuit operation can be realized.

(15) In addition, each of the first to seventh input terminals and first to fifth output terminals is constructed by a pair of terminals for transmitting complementary signals. Each of the first to third latch circuits has a pair of CMOS inverter circuits having input and output terminals which are connected so as to cross each other and each of first to third switching MOSFETs for receiving each of the first to third operation timing signals and passing an operation current to the CMOS inverter circuits. Thus, a simple amplifying operation can be performed at high speed.

(16) In addition, storage information of a plurality of memory cells provided in correspondence with the word lines and the complementary bit line pairs is amplified by a sense amplifier as a first amplification circuit, is read through a first selection circuit and output to a first common complementary line pair, is selected by a second selection circuit, and is transmitted to a second common complementary line pair. The read signals from the memory cell sent to the second common complementary line pair are used as input signals and amplified. Consequently, signals from a memory of a large storage capacity can be outputted at high speed and, moreover, with a necessary operation margin.

(17) In addition, the first and second input signals are simultaneously supplied in response to a clock signal, and, in accordance with each of a first state and a second state in the first operation mode, output signals corresponding to the first and second input signals are successively sent to the output circuit at both a rising edge and a trailing edge of a clock signal. Thus, a reading operation can be successively carried out at high speed.

(18) When one of two signals is outputted in a first operation mode and both signals are outputted in a second operation mode, first to third latch circuits are assigned to the two signals. Two latch circuits and a selection signal are used in correspondence with a signal to be outputted from the first operation mode. When output signals of the two latch circuits are different from each other, in place of an output signal of the latch circuit which operates in advance, an output signal of the latch circuit which operates behind is outputted. When both signals are to be outputted in the second operation mode, the operation frequency is set to a low frequency and an output signal generated by the two latch circuits is outputted. Consequently, two types of outputting operations can be realized with a simple circuit.

(19) In addition, each of the first to third input terminals is provided with switching means for capacitively isolating a signal line for transmitting the input signal in an operation period of each of the first to third latch circuits in response to each of the first to third operation timing signals. By this means, an amplifying operation can be realized at high speed with a simple circuit.

(20) In addition, the first operation mode is a normal operation mode and the second operation mode is a test operation mode in which the first and second output signals are supplied to a test circuit. By this arrangement, the test operation can be efficiently conducted is produced.

Although the invention achieved by the inventors has been specifically described above with reference to various embodiments, obviously, the invention is not limited to the embodiments, but can be variously modified without departing from the gist of the invention. For example, the amplification circuit can be widely used as a main amplifier provided for a dynamic RAM as described above, an amplification circuit provided at the front stage of an output circuit for receiving an amplification signal of a main amplification, an input circuit provided for an input section of a circuit block assembled in a system LSI, or a circuit for amplifying a signal transmitted through a signal bus provided in a circuit block. The memory circuit is not limited to a dynamic memory cell as described above, but may be a nonvolatile memory using a ferroelectric capacitor as storing means or a nonvolatile memory cell for storing charges in a floating gate. The invention can be widely used for various semiconductor integrated circuit devices each using an amplification circuit.

Effects of the invention will be described briefly as follows. A selection circuit is provided for first and second latch circuits which operate in response to first and second operation timing signals, respectively. By the selection circuit, a first operation of transmitting a signal corresponding to a first output signal of the first latch circuit to a third output terminal, and a second operation of transmitting a second output signal in place of the first output signal to the third output terminal when the first output is different from the second output signal of the second latch circuit are performed. The second operation timing signal is generated behind the first o potation timing signal, and the operation period of the second latch circuit is made shorter than that in the operation started by the second operation timing in accordance with the operation frequency or a coincidence signal of the first and second outputs in the first operation.

What is claimed is:

1. A semiconductor integrated circuit device comprising:
   a first latch circuit which has a first input terminal for receiving an input signal and a first output terminal, and operates in response to a first operation timing signal;
   a second latch circuit which has a second input terminal for receiving said input signal and a second output terminal, and operates in response to a second operation timing signal; and
   a selection circuit which has a third input terminal for receiving a first output signal from said first output terminal, a fourth input terminal for receiving a second output signal from said second output terminal, and a third output terminal,
   wherein said selection circuit performs a first operation of transmitting a signal corresponding to said first output signal to said third output terminal and, when said first and second output signals are different from each other, performs a second operation of transmitting the second output signal in place of said first output signal to said third output terminal,
   wherein said second operation timing signal is generated behind said first operation timing signal, and wherein said second latch circuit is limited to an operation period shorter than an operation period of said second operation timing signal in accordance with either an operation frequency or a detection signal of coincidence between said first and second output signals in said first operation.

2. The semiconductor integrated circuit device according to claim 1, wherein each of said first and second input terminals is provided with switching means for capacitively isolating a signal line for transmitting said input signal in an operation period of said first and second latch circuits in response to said first and second operation timing signals.

3. The semiconductor integrated circuit device according to claim 2, wherein said first output terminal is provided with a first precharge circuit which is operated by a first precharge signal generated in response to completion of the operation of said first latch circuit,
   wherein said second output terminal is provided with a second precharge circuit which is operated by a second precharge signal generated in response to completion of the operation of said second latch circuit, and
   wherein, when said first precharge signal is preceding to an ending timing of said second operation timing, said second operation timing signal is finished by the first precharge signal.

4. The semiconductor integrated circuit device according to claim 2 or 3,
   wherein each of said first to fourth input terminals and first to third output terminals is a pair of terminals for transmitting complementary signals,
   wherein said first latch circuit has a pair of first and second CMOS inverter circuits of which input and output terminals are connected so as to cross each other and a first switching MOSFET for receiving said first operation timing signal and passing an operation current to the first and second CMOS inverter circuits, and
   wherein said second latch circuit has a pair of third and fourth CMOS inverter circuits of which input and output terminals are connected so as to cross each other, and a second switching MOSFET for receiving said second operation timing signal and passing an operation current to the third and fourth CMOS inverter circuits.

5. The semiconductor integrated circuit device according to claim 4,
wherein a plurality of said input signals are successively transmitted in response to clock signals, and wherein said first and second operation timing signals are generated in response to said clock signals.

6. The semiconductor integrated circuit device according to claim 5, wherein an output circuit having a latching function including a pair of latch circuits corresponding to said first and second latch circuits is provided on an output side of said selection circuit.

7. The semiconductor integrated circuit device according to claim 4, further comprising:
a memory cell array having a plurality of word lines, a plurality of complementary bit line pairs, and a plurality of memory cells provided in correspondence with the word lines and the complementary bit line pairs;
a plurality of first amplification circuits for amplifying signals of said plurality of complementary bit line pairs;
a first selection circuit for selecting any of said plurality of first amplification circuits;
a plurality of memory blocks each having a first common complementary line pair provided for said first selection circuit;
a plurality of second selection circuits for selecting said first common complementary line pair corresponding to said plurality of memory blocks; and a second common complementary line pair provided for said plurality of second selection circuits,
wherein a read signal from said memory cell sent to said second common complementary line pair is used as said input signal.

8. The semiconductor integrated circuit device according to claim 7, wherein a plurality of said input signals are successively sent at both a rising edge and a trailing edge of a clock signal.

9. The semiconductor integrated circuit device according to claim 1, further comprising:
a circuit which inhibits an operation of generating said second operation timing signal.

10. The semiconductor integrated circuit device according to claim 1, wherein an input signal supplied to the first input terminal of said first latch circuit is an amplification signal outputted from a differential amplification circuit.

11. A semiconductor integrated circuit device comprising:
a first latch circuit which has a first input terminal for receiving a first input signal and a first output terminal, and operates in response to a first operation timing signal;
a second latch circuit which has a second input terminal for receiving a second input signal and a second output terminal, and operates in response to a second operation timing signal;
a third latch circuit which has a third input terminal and a third output terminal, and operates in response to a third operation timing signal;
a first selection circuit which has a fourth input terminal for receiving a first output signal from said first output terminal, a fifth input terminal, and a fourth output terminal;
a second selection circuit which has a sixth input terminal for receiving a second output signal from the second output terminal of said second latch circuit, a seventh input terminal, and a fifth output terminal;
a first switch for transmitting said first input signal to said third input terminal and transmitting a third output signal of said third latch circuit to said fifth input terminal in a first state; and
a second switch for transmitting said second input signal to said third input terminal and transmitting the third output signal of said third latch circuit to said seventh input terminal in a second state,
wherein said first selection circuit performs a first operation of transmitting a signal corresponding to said third output signal to said fourth output terminal in said first state, and a second operation of transmitting the first output signal in place of said fourth output signal to said third output terminal when said third and first output signals are different from each other,
wherein said first selection circuit performs a third operation of transmitting said first output signal to said fourth output terminal in said second state,
wherein said first operation timing signal in said first state is generated behind said third operation timing signal,
wherein said first latch circuit is limited to an operation period shorter than an operation period of said first timing signal in accordance with an operation frequency or a detection signal of coincidence of said first and third output signals in said first operation,
wherein said second selection circuit performs a fourth operation of transmitting a signal corresponding to said third output signal to said fifth output terminal in said second state, and a fifth operation of transmitting said second output signal in place of said third output signal to said fifth output terminal when said third and second output signals are different from each other,
wherein said second selection circuit performs a sixth operation of transmitting said second output signal to said fifth output terminal in said first state in said first operation mode,
wherein said second operation timing signal in said second state is generated behind said third operation timing signal, and
wherein said second latch circuit is limited to an operation period shorter than an operation period by said second timing signal in accordance with the operation frequency or a detection signal of coincidence between said third and second output signals in said fourth operation.

12. The semiconductor integrated circuit device according to claim 11, wherein each of said first to third input terminals is provided with switching means for capacitively isolating a signal line for transmitting said input signal in an operation period of said first to third latch circuits in response to said first to third operation timing signals.

13. The semiconductor integrated circuit device according to claim 12, further comprising:
an output circuit shared by said first and second selection circuits, wherein said first and second input signals are supplied at the same timing,
wherein, in said first state, a first output signal corresponding to said first input signal is outputted from said output circuit and, after that, a second output signal corresponding to said second input signal is outputted from said output circuit, and wherein, in said second state, the second output signal corresponding to said second input signal is outputted from said output circuit and, after that, the first output signal corresponding to said first input signal is outputted from said output circuit.

14. The semiconductor integrated circuit device according to claim 13, wherein said first output terminal is provided with a first precharge circuit which is operated by a first precharge signal generated in response to completion of the operation of said first latch circuit, wherein said second output terminal is provided with a second precharge circuit which is operated by a second precharge signal generated in response to completion of the operation of said second latch circuit, wherein said third output terminal is provided with a third precharge circuit which is operated by a third precharge signal generated in response to completion of the operation of said third latch circuit, wherein, when the third precharge signal is preceding to an ending timing of said first operation timing signal in the first state in said first operation mode, said first operation timing signal is finished by the third precharge signal, and wherein, when the third precharge signal is preceding to an ending timing of said second operation timing signal in the second state in said first operation mode, said second operation timing signal is finished by the third precharge signal.

15. The semiconductor integrated circuit device according to claim 13 or 14, wherein each of said first to seventh input terminals and first to fifth output terminals is a pair of terminals for transmitting complementary signals, wherein said first latch circuit has a pair of first and second CMOS inverter circuits of which input and output terminals are connected so as to cross each other and a first switching MOSFET for receiving said first operation timing signal and passing an operation current to the first and second CMOS inverter circuits, wherein said second latch circuit has a pair of third and fourth CMOS inverter circuits of which input and output terminals are connected so as to cross each other, and a second switching MOSFET for receiving said second operation timing signal and passing an operation current to the third and fourth CMOS inverter circuits, and wherein said third latch circuit has a pair of fifth and sixth CMOS inverter circuits of which input and output terminals are connected so as to cross each other, and a third switching MOSFET for receiving said third operation timing signal and passing an operation current to the fifth and six th CMOS inverter circuits.

16. The semiconductor integrated circuit device according to claim 15, further comprising:

a memory cell array having a plurality of word lines, a plurality of complementary bit line pairs, and a plurality of memory cells provided in correspondence with the word lines and the complementary bit line pairs; a plurality of first amplification circuits for amplifying signals of said plurality of complementary bit line pairs;

a first selection circuit for selecting said plurality of first amplification circuits;

a plurality of memory blocks each having a first common complementary pairs provided for said first selection circuit;

a plurality of second selection circuits for selecting said first common complementary pair corresponding to said plurality of memory blocks; and a second common complementary pair provided for said plurality of second selection circuits, wherein said second common complementary pair is provided in correspondence with each of said first input signal and said second input signal, and read signals from said memory cell sent to said second common complementary pair are used as said first and second input signals.

17. The semiconductor integrated circuit device according to claim 16, wherein said first and second input signals are simultaneously supplied in response to a clock signal and, in accordance with each of a first state and a second state in said first operation mode, output signals corresponding to said first and second input signals are successively sent to said output circuit at both a rising edge and a trailing edge of a clock signal.

18. A semiconductor integrated circuit device comprising:

a first latch circuit which has a first input terminal for receiving a first input signal and a first output terminal, and operates in response to a first operation timing signal;

a second latch circuit which has a second input terminal for receiving said input signal and a second output terminal, and operates in response to a second operation timing signal;

a third latch circuit which has a third input terminal and a third output terminal, and operates in response to a third operation timing signal;

a first selection circuit which has a fourth input terminal for receiving a first output signal from said first output terminal of said first latch circuit, a fifth input terminal, and a fourth output terminal;

a second selection circuit having a sixth input terminal for receiving a second output signal from the second output terminal of said second latch circuit, a seventh input terminal, and a fifth output terminal;

a first switch for transmitting said first input signal to said third input terminal and transmitting the third output signal of said third latch circuit to said fifth input terminal in a first state in a first operation mode; and a second switch for transmitting said second input signal to said third input terminal and transmitting the third output signal of said third latch circuit to said seventh input terminal in a second state in the first operation mode, wherein said first selection circuit performs a first operation of transmitting a signal corresponding to said third output signal to said third output terminal in a first state in said first operation mode, and a second operation of transmitting the first output signal in place of said third output signal to said third output terminal when said third and first output signals are different from each other, wherein said first selection circuit performs a third operation of transmitting said first output signal to said third output terminal in a second state in said first operation mode, wherein said first operation timing signal in said first state in said first operation mode is generated behind said third operation timing signal, wherein said first latch circuit is limited to an operation period shorter than an operation period of said first timing signal in accordance with an operation frequency or a detection signal of coincidence of said first and third output signals in said first operation, wherein said second selection circuit performs a fourth operation of transmitting a signal corresponding to said third output signal to said fourth output terminal in said second state in said first operation mode, and a fifth operation of transmitting said second output signal in place of said third output signal to said fourth output terminal when said third and second output signals are different from each other, wherein said second selection circuit performs a sixth operation of transmitting said second output signal to said fourth output terminal in said first state in said first operation mode, wherein said second operation timing signal in said second state in said first operation mode is generated behind said third operation timing signal, wherein said second latch circuit is limited to an operation period shorter than an operation period by said second timing signal in accordance with the operation frequency or a detection signal of coincidence between said third and second output signals in said fourth operation, and wherein either said first or second switch is set to said connection state in a second operation mode, said first and second operation timings are set behind those in said first operation mode, and first and second output signals corresponding to first and second input signals are outputted in parallel through said first and second selection circuits.

19. The semiconductor integrated circuit device according to claim 18, wherein each of said first to third input terminals is provided with switching means for capacitively isolating a signal line for transmitting said input signal in an operation period of said first to third latch circuits in response to said first to third operation timing signals.

20. The semiconductor integrated circuit device according to claim 19, wherein said first operation mode is a normal operation mode and wherein said second operation mode is a test operation mode in which said first and second output signals are supplied to a test circuit.

21. A semiconductor integrated circuit device comprising:

a first amplification circuit which receives an input signal from a first input terminal;

a second amplification circuit which receives an input signal from a second input terminal; and a selection circuit which outputs one of a first output signal of said first amplification circuit and a second output signal of said second amplification circuit, wherein an operation start timing of said second amplification circuit is set behind an operation start timing of said first amplification circuit, wherein said selection circuit receives said first output signal and then said second output signal, wherein, when said second output signal is different from said first output signal, said selection circuit switches an output of said first output signal to an output of said second output signal so that said second output signal can be outputted, and wherein said second amplification circuit is controlled so that an operation period of said second amplification circuit becomes shorter than an operation period of said first amplification circuit.

\* \* \* \* \*